US012698442B2

(12) United States Patent
Kim et al.

(10) Patent No.: US 12,698,442 B2
(45) Date of Patent: Aug. 4, 2026

(54) ELECTROLUMINESCENT DEVICE AND SEMICONDUCTOR NANOPARTICLE

(71) Applicant: Samsung Electronics Co., Ltd., Suwon-si (KR)

(72) Inventors: Sung Woo Kim, Hwaseong-si (KR); Yuho Won, Seoul (KR); Eun Joo Jang, Suwon-si (KR); Hyo Sook Jang, Suwon-si (KR)

(73) Assignees: SAMSUNG ELECTRONICS CO., LTD., Gyeonggi-Do (KR); SAMSUNG DISPLAY CO., LTD., Gyeonggi-Do (KR)

( * ) Notice: Subject to any disclaimer, the term of this patent is extended or adjusted under 35 U.S.C. 154(b) by 727 days.

(21) Appl. No.: 17/897,609

(22) Filed: Aug. 29, 2022

(65) Prior Publication Data

US 2023/0079704 A1      Mar. 16, 2023

(30) Foreign Application Priority Data

Aug. 30, 2021      (KR) ........................ 10-2021-0115098

(51) Int. Cl.
*C09K 11/88*          (2006.01)
*B82Y 20/00*          (2011.01)
(Continued)

(52) U.S. Cl.
CPC .......... *C09K 11/885* (2013.01); *C01B 19/007* (2013.01); *H10K 50/115* (2023.02);
(Continued)

(58) Field of Classification Search
CPC .. C09K 11/885; C01B 19/007; H10K 50/115; H10K 2102/351; B82Y 20/00;
(Continued)

(56) References Cited

U.S. PATENT DOCUMENTS

| | | |
|---|---|---|
| 10,050,189 B2 | 8/2018 | Mehta et al. |
| 10,424,695 B2 | 9/2019 | Won et al. |

(Continued)

FOREIGN PATENT DOCUMENTS

| | | |
|---|---|---|
| KR | 1020150016436 A | 2/2015 |
| KR | 20180013801 A | 2/2018 |
| WO | 2018048316 A1 | 3/2018 |

OTHER PUBLICATIONS

Office Action dated Dec. 6, 2023 of the corresponding Korean Patent Application No. 10-2021-0115098.

(Continued)

*Primary Examiner* — Jay C Kim
*Assistant Examiner* — Woo K Lee
(74) *Attorney, Agent, or Firm* — CANTOR COLBURN LLP

(57)          ABSTRACT

A semiconductor nanoparticle, a production method thereof, and an electroluminescent device including the same. The production method includes: combining a magnesium precursor and an additive with a chalcogen precursor in a reaction medium including an organic solvent and an organic ligand; heating the reaction medium to a reaction temperature; and reacting the magnesium precursor and the chalcogen precursor in the presence of the additive to form a magnesium chalcogenide, wherein the semiconductor nanoparticle comprises the magnesium chalcogenide, wherein the magnesium chalcogenide comprises magnesium; and selenium, sulfur, or a combination thereof, and wherein the additive includes a hydride compound including an alkali metal, calcium, barium, aluminum, or a combination thereof.

24 Claims, 10 Drawing Sheets
(1 of 10 Drawing Sheet(s) Filed in Color)

(51) Int. Cl.

| | | |
|---|---|---|
| *B82Y 40/00* | (2011.01) | |
| *C01B 19/00* | (2006.01) | |
| *H10K 50/115* | (2023.01) | |
| *H10K 102/00* | (2023.01) | |

(52) U.S. Cl.
CPC .............. *B82Y 20/00* (2013.01); *B82Y 40/00* (2013.01); *C01P 2002/72* (2013.01); *C01P 2002/85* (2013.01); *C01P 2004/02* (2013.01); *C01P 2004/04* (2013.01); *C01P 2004/64* (2013.01); *C01P 2006/40* (2013.01); *H10K 2102/351* (2023.02)

(58) Field of Classification Search
CPC .. B82Y 40/00; C01P 2002/72; C01P 2002/85; C01P 2004/02; C01P 2004/04; C01P 2004/64; C01P 2006/40
See application file for complete search history.

(56) References Cited

U.S. PATENT DOCUMENTS

| | | | |
|---|---|---|---|
| 2010/0108530 | A1 | 5/2010 | Zehnder et al. |
| 2011/0229397 | A1* | 9/2011 | Bartel ...................... C01G 9/08 |
| | | | 422/240 |
| 2011/0315927 | A1* | 12/2011 | Tulsky ................... C01B 17/20 |
| | | | 252/301.4 F |
| 2013/0299772 | A1 | 11/2013 | Cohen et al. |
| 2016/0214862 | A1* | 7/2016 | Kim ...................... C01B 19/007 |
| 2018/0033856 | A1 | 2/2018 | Kwon et al. |

OTHER PUBLICATIONS

Akiyoshi Mikami, et al., Effect of Zn-doping on Luminescent Characteristics of MgS: Eu and Mg Ca S:Eu Red Phosphors, IDW '02, 963-966.

Extended European Search Report dated Jan. 17, 2023, of the corresponding European Patent Application No. 22192783.3, 5 pp.

K. Kavi Rasu, et al., Investigation on the structural and optical properties of Mn2+ doped MgS nanoparticles synthesized by hydrothermal method, Optik, 2021, 10 pp.

Rachel Woods-Robinson et al., "Wide Band Gap Chalcogenide Semiconductors," Chem. Rev., 2020, pp. 1-49 (A-AW), DOI: 10.1021/acs.chemrev.9b00600.

* cited by examiner

ELECTROLUMINESCENT DEVICE AND SEMICONDUCTOR NANOPARTICLE

CROSS-REFERENCE TO RELATED APPLICATION

This application claims priority to Korean Patent Application No. 10-2021-0115098 filed in the Korean Intellectual Property Office on Aug. 30, 2021, and all the benefits accruing therefrom under 35 U.S.C. § 119, the content of which in its entirety is herein incorporated by reference.

BACKGROUND

1. Field

The present disclosure relates to a production method of a semiconductor nanoparticle, a semiconductor nanoparticle, and a device including the same.

2. Description of the Related Art

A semiconductor nanoparticle (e.g., semiconductor nanocrystal particle) may emit light. For example, a quantum dot including a semiconductor nanocrystal may exhibit a quantum confinement effect, showing, e.g., exhibiting, luminance properties. Light emission of a semiconductor nanoparticle may be generated for example when an electron in an excited state, by light excitation or by application of a voltage, transitions from a conduction band to a valence band. The semiconductor nanoparticle may be configured to emit light of a desired wavelength region by controlling a size of the semiconductor nanoparticle, a composition of the semiconductor nanoparticle, or a combination thereof.

Nanoparticles may be used in a light emitting device (e.g., an electroluminescent light emitting device) and a display device including the same.

SUMMARY

An embodiment provides a method of producing a semiconductor nanoparticle.

An embodiment provides a semiconductor nanoparticle.

An embodiment provides a luminescent device or an electronic apparatus.

In an embodiment, a method of producing a semiconductor nanoparticle includes:

combining a magnesium precursor and an additive with a chalcogen precursor in a reaction medium including an organic solvent and an organic ligand;

heating the reaction medium to a reaction temperature; and reacting the magnesium precursor and the chalcogen precursor in the presence of the additive to form a magnesium chalcogenide, wherein the additive includes a hydride compound including an alkali metal, calcium, barium, aluminum, or a combination thereof, wherein the semiconductor nanoparticle includes a magnesium chalcogenide, wherein the magnesium chalcogenide includes magnesium; and selenium, sulfur, or a combination thereof.

The alkali metal may include lithium, sodium, potassium, or a combination thereof.

The additive may include an alkaline earth metal (e.g., calcium, barium, or a combination thereof). The alkaline earth metal may include or may not include magnesium.

In a method of an embodiment, the method includes adding the magnesium precursor to the reaction medium simultaneously with the additive.

In a method of an embodiment, the method includes adding the magnesium precursor to the reaction medium after adding the additive to the reaction medium.

The magnesium precursor may be mixed with an amine compound and then added to the reaction medium.

The additive may be mixed with an aromatic phosphine compound and then added to the reaction medium.

The reaction medium may be substantially oxygen-free, e.g., may not include oxygen.

The magnesium chalcogenide may be crystalline.

The magnesium chalcogenide may exhibit a pattern of a cubic crystalline structure by an X-ray diffraction analysis.

The semiconductor nanoparticle and the magnesium chalcogenide may not exhibit a peak of or may be substantially free of a magnesium oxide, a magnesium hydroxide, or a combination thereof.

The hydride compound may further include a substituted or unsubstituted so alkyl group, boron, or a combination thereof.

The additive may include a metal. The additive or the metal may include sodium, potassium, lithium, calcium, barium, aluminum, or a combination thereof.

The magnesium precursor may include a magnesium powder, an alkylated magnesium, an alkenylated magnesium, an arylated magnesium, a magnesium halide, a magnesium cyanide, a magnesium sulfate, a magnesium sulfonate, a magnesium nitrate, or a combination thereof.

The additive may include a substituted or unsubstituted dialkyl lithium borohydride, a substituted or unsubstituted dialkyl sodium borohydride, a substituted or unsubstituted dialkyl potassium borohydride, a lithium aluminum hydride, a substituted or unsubstituted aluminum hydride, a sodium borohydride, a sodium hydride, a lithium triethylborohydride, $NaBH_4$, a diisobutylaluminum hydride (DIBAL-H), or a combination thereof.

The organic solvent may include a primary amine, a secondary amine, a tertiary amine, a nitrogen-containing heterocyclic compound, a substituted or unsubstituted $C_{4\text{-}50}$ aliphatic hydrocarbon solvent, a substituted or unsubstituted $C_{6\text{-}50}$ aromatic hydrocarbon solvent, a substituted or unsubstituted phosphine solvent, a substituted or unsubstituted phosphine oxide solvent, an aromatic ether solvent, or a combination thereof.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, $R_2POOH$, or a combination thereof (wherein R and R' are each independently a substituted or unsubstituted $C_{1\text{-}40}$ aliphatic hydrocarbon, a substituted or unsubstituted $C_{6\text{-}40}$ aromatic hydrocarbon, or a combination thereof.

The chalcogen precursor may include an organic solvent and selenium (e.g., an organic solvent dispersion of selenium), an organic solvent and sulfur (e.g., an organic solvent dispersion of sulfur), a thiol compound, a bistrimethylsilyl alkyl sulfide, an ammonium sulfide, a sodium sulfide, an organic solvent and tellurium (e.g., an organic solvent dispersion of tellurium), or a combination thereof.

In a method of an embodiment, the magnesium precursor, the chalcogen precursor, the organic ligand, and the organic solvent may not include an oxygen containing moiety.

The method may further include adding a $C_{6\text{-}50}$ aromatic phosphine compound to the reaction medium.

The $C_{6-50}$ aromatic phosphine compound may include an aryl phosphine compound, a diaryl phosphine compound, a triaryl phosphine compound, or a combination thereof.

The reaction medium may further include a particle including a semiconductor nanocrystal core, and the magnesium chalcogenide may be formed on a surface of the particle.

The semiconductor nanocrystal core may include a zinc chalcogenide, an indium phosphide, an indium zinc phosphide, an indium gallium phosphide, or a combination thereof.

A amount of the additive as used may be, per one mole of magnesium, greater than or equal to about 0.05 moles, greater than or equal to about 0.1 moles, greater than or equal to about 0.15 moles, greater than or equal to about 0.2 moles, greater than or equal to about 0.23 moles, greater than or equal to about 0.25 moles, greater than or equal to about 0.5 moles, greater than or equal to about 0.6 moles, greater than or equal to about 0.65 moles, greater than or equal to about 0.7 moles, greater than or equal to about 0.75 moles, greater than or equal to about 0.8 moles, or greater than or equal to about 1 moles.

The amount of the additive may be, per one mole of magnesium, less than or equal to about 20 moles, less than or equal to about 10 moles, less than or equal to about 5 moles, less than or equal to about 3 moles, or less than or equal to about 2 moles.

In the method, an amount of the chalcogen precursor as used may be, per one mole of magnesium, greater than or equal to about 0.2 moles, greater than or equal to about 0.5 moles, greater than or equal to about 0.6 moles, greater than or equal to about 0.7 moles, or greater than or equal to about 1 moles, and less than or equal to about 10 moles, or less than or equal to about 5 moles.

The semiconductor nanoparticle may further include an alkali metal, aluminum, boron, or a combination thereof. The semiconductor nanoparticle may further include an alkaline earth metal.

In an X-ray photoelectron spectroscopy analysis of the semiconductor nanoparticle, a peak assigned to magnesium (Mg) may appear at a binding energy of greater than or equal to about 50 electronvolts (eV), or greater than or equal to about 50.1 eV and less than or equal to about 55 eV, less than or equal to about 54 eV, less than or equal to about 53 eV, less than or equal to about 52.5 eV, less than or equal to about 52 eV, or less than or equal to about 51 eV.

The method may further include adding a zinc precursor to the reaction medium after the initiation of the reaction.

The magnesium chalcogenide may include a zinc magnesium chalcogenide.

The zinc precursor may include a zinc powder, a zinc oxide, a hydrocarbyl zinc, a zinc alkoxide, a zinc carboxylate, a zinc nitrate, a zinc sulfate, a zinc acetylacetonate, a zinc halide, a zinc cyanide, a zinc hydroxide, or a combination thereof.

In an embodiment, a semiconductor nanoparticle may include a crystalline magnesium chalcogenide and a dopant, wherein the dopant includes an alkali metal, aluminum, boron, an alkaline earth metal (e.g., calcium, barium, or a combination thereof), or a combination thereof, a size (or an average size) of the semiconductor nanoparticle(s) is greater than or equal to about 5 nanometers (nm) and less than or equal to about 50 nm, the semiconductor nanoparticle does not include cadmium, in the semiconductor nanoparticle, a mole ratio of the dopant (or a mole ratio of alkali metal, aluminum, boron, calcium, barium, or a combination thereof) to the magnesium may be greater than or equal to about 0.001:1, greater than or equal to about 0.005:1, greater than or equal to about 0.01:1, and less than or equal to about 1:1, and the semiconductor nanoparticle(s) is (are) configured to emit light. The semiconductor nanoparticle may exhibit an absolute quantum yield of greater than or equal to about 5%, greater than or equal to about 10%, greater than or equal to about 50%, or greater than or equal to about 80%, and less than or equal to about 100%.

The magnesium chalcogenide or the semiconductor nanoparticle may exhibit a cubic crystalline structure as determined by an X-ray diffraction analysis.

The magnesium chalcogenide may include a magnesium selenide, a magnesium sulfide, a magnesium telluride, a magnesium selenide sulfide, a magnesium selenide telluride, a magnesium telluride sulfide, a zinc magnesium selenide, a zinc magnesium sulfide, a zinc magnesium telluride, a zinc magnesium selenide sulfide, a zinc magnesium selenide telluride, a zinc magnesium telluride sulfide, or a combination thereof.

The magnesium chalcogenide may include MgSe, MgSeS, MgS, ZnMgSe, ZnMgSeS, ZnMgS, or a combination thereof.

In the semiconductor nanoparticle, a mole ratio of an alkali metal (lithium, sodium, potassium, or a combination thereof) to magnesium may be greater than or equal to about 0.001:1, greater than or equal to about 0.005:1, greater than or equal to about 0.01:1, greater than or equal to about 0.03:1, or greater than or equal to about 0.05:1 and less than or equal to about 5:1.

In the semiconductor nanoparticle, a mole ratio of aluminum to magnesium may be greater than or equal to about 0.001:1, greater than or equal to about 0.005:1, or greater than or equal to about 0.01:1 and less than or equal to about 1:1, or less than or equal to about 0.1:1.

In the X-ray photoelectron spectroscopy analysis of the semiconductor nanoparticle, a peak assigned to the Mg may appear at a binding energy of greater than about 50 eV, or greater than or equal to about 50.1 eV and less than or equal to about 55 eV, less than or equal to about 54 eV, less than or equal to about 53 eV, less than or equal to about 52.5 eV, less than or equal to about 52 eV, or less than or equal to about 51 eV.

The semiconductor nanoparticle may include a semiconductor nanocrystal core and a semiconductor nanocrystal shell disposed on the semiconductor nanocrystal core.

The semiconductor nanocrystal core may include the magnesium chalcogenide and the dopant, and the semiconductor nanocrystal shell may include a zinc chalcogenide, an indium phosphide, an indium gallium phosphide, or a combination thereof.

The semiconductor nanocrystal core may include a zinc chalcogenide, and the semiconductor nanocrystal shell may include the magnesium chalcogenide and the dopant.

An embodiment provides a population of the semiconductor nanoparticles described herein.

In an embodiment is provided a light emitting device, which includes a first electrode and a second electrode spaced apart from each other (e.g., each having a surface opposite the other, i.e., each with a surface, facing the other); and a light emitting layer disposed between the first electrode and the second electrode, the light emitting layer includes the aforementioned semiconductor nanoparticles.

The light emitting device may further include a charge auxiliary layer between the light emitting layer and the first electrode, between the light emitting layer and the second electrode, or a combination thereof.

5

6

The charge auxiliary layer may include a hole auxiliary layer between the light emitting layer and the first electrode.

The charge auxiliary layer may include an electron auxiliary layer between the light emitting layer and the second electrode.

The charge auxiliary layer may include a hole auxiliary layer between the light emitting layer and the first electrode and an electron auxiliary layer between the light emitting layer and the second electrode.

The charge auxiliary layer may include a hole auxiliary layer including an organic compound, an electron auxiliary layer including metal oxide (e.g., zinc magnesium oxide) nanoparticles, or a combination thereof.

In an embodiment, a display device or an electronic device may include the electroluminescent device or the semiconductor nanoparticles.

The display device or an electronic device may include (or may be) a handheld terminal, a monitor, a notebook computer, a television, an electronic display board, a camera, a part for an automatic vehicle.

In an embodiment is provided a method of producing a semiconductor nanoparticle, which includes combining a magnesium precursor and a chalcogen precursor in a reaction medium comprising an organic solvent and an organic ligand; and reacting the magnesium precursor and the chalcogen to form a magnesium chalcogenide, wherein the magnesium precursor, the chalcogen precursor, the organic ligand, and the organic solvent do not include an oxygen containing moiety, and wherein the semiconductor nanoparticle is configured to emit blue light.

According to an embodiment, a crystalline magnesium chalcogenide nanoparticle substantially free of magnesium oxide or magnesium hydroxide may be prepared. The prepared magnesium chalcogenide nanoparticle may be used as an inorganic shell an appropriate bandgap energy for a nanoparticle emitting light of a desired wavelength (e.g., blue light)

BRIEF DESCRIPTION OF THE DRAWINGS

The patent or application file contains at least one drawing executed in color. Copies of this patent or patent application publication with the color drawing(s) will be provided by the Office upon request and payment of the necessary fee.

The above and other advantages and features of this disclosure will become more apparent by describing in further detail exemplary embodiments thereof with reference to the accompanying drawings, in which.

DETAILED DESCRIPTION

Figure 1:
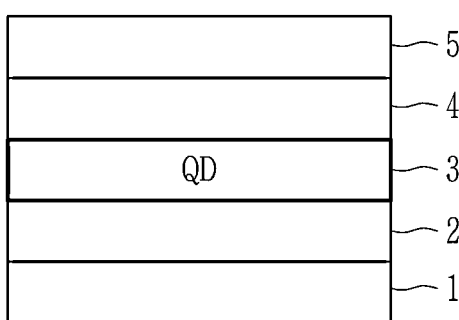
FIG. 1 is a schematic cross-sectional view of a light-emitting device including a semiconductor nanoparticle according to an embodiment.

Advantages and characteristics of this disclosure, and a method for achieving the same, will become evident referring to the following example embodiments together with the drawings attached hereto. However, the embodiments should not be construed as being limited to the embodiments set forth herein. Rather, these embodiments are provided so that this disclosure will be thorough and complete, and will fully convey the scope of the invention to those skilled in the art.

In order to clearly explain the present disclosure, parts irrelevant to the description are omitted, and the same reference numerals are assigned to the same or similar elements throughout the specification.

The size and thickness of each constituent element as shown in the drawings are indicated for better understanding and ease of description, and this disclosure is not necessarily limited to sizes or thicknesses as shown. In the drawings, the thickness of layers, films, panels, regions, etc., are exaggerated for clarity. And in the drawings, for convenience of description, the thickness of some layers and regions are exaggerated. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In addition, it will be understood that when an element such as a layer, film, region, or substrate is referred to as being "on" another element, it can be directly on the other element or intervening elements may also be present. In contrast, when an element is referred to as being "directly on" another element, there are no intervening elements present. Also, to be disposed "on" the reference portion means to be disposed above or below the reference portion and does not necessarily mean "above".

It will be understood that, although the terms "first," "second," "third" etc., may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as being limited to "a" or "an." "or" means "and/or."

As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used, e.g., non-technical, dictionaries, should be interpreted as having a meaning that is consistent with their meaning in the context of the relevant art and the present disclosure, and will not be interpreted in an idealized or overly formal sense unless expressly so defined herein.

Hereinafter, values of a work function, a conduction band, or a lowest unoccupied molecular orbital (LUMO) (or valence band or highest occupied molecular orbital (HOMO)) energy level is expressed as an absolute value from a vacuum level. In addition, when the work function or the energy level is referred to be "deep," "high" or "large," the work function or the energy level has a large absolute value based on "0 eV" of the vacuum level, while when the work function or the energy level is referred to be "shallow," "low," or "small," the work function or energy level has a small absolute value based on "0 eV" of the vacuum level.

In an embodiment, the HOMO energy level, LUMO energy level, or a work function recited herein may be a value measured by an appropriate method, which is not particularly limited. In an embodiment, the HOMO energy level, LUMO energy level, or a work function recited herein may be measured by using a Cyclic Volumetry method, a spectroscopy method such as an ultraviolet-visible (UV-Vis) spectroscopy, Ultraviolet Photoelectron Spectroscopy (UPS), a Photoelectron spectroscopy in air (e.g., AC-3), a Kelvin Probe force microscopy, or a combination thereof.

As used herein, a number of carbon atoms in a group or a molecule may be referred to as a subscript (e.g., $C_{6-50}$) or as C6 to C50.

As used herein, when a definition is not otherwise provided, "substituted" refers to replacement of a, e.g., at least one, hydrogen of a compound or the corresponding moiety by a C1 to C30 alkyl group, a C1 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—$NO_2$), a cyano group (—CN), an amino group (—NRR' wherein R and R' are each independently hydrogen or a C1 to C6 alkyl group), an azido group (—$N_3$), an amidino group (—C(=NH)$NH_2$), a hydrazino group (—$NHNH_2$), a hydrazono group (=N($NH_2$)), an aldehyde group (—C(=O)H), a carbamoyl group (—C(O)$NH_2$), a thiol group (—SH), an ester group (—C(=O)OR, wherein R is a C1 to C6 alkyl group or a C6 to C12 aryl group), a carboxyl group (—COOH) or a salt thereof (—O(=O)OM, wherein M is an organic or inorganic cation), a sulfonic acid group (—$SO_3H$) or a salt thereof (—$SO_3M$, wherein M is an organic or inorganic cation), a phosphoric acid group (—$PO_3H_2$) or a salt thereof (—$PO_3MH$ or —$PO_3M_2$, wherein M is an organic or inorganic cation), or a combination thereof. The total number of carbon atoms in a group may be inclusive of any substituents, e.g., a cyanoethyl group is a C3 alkyl group.

As used herein, when a definition is not otherwise provided, "hydrocarbon" or "hydrocarbon group" refers to a compound or a group including carbon and hydrogen (e.g., alkyl, alkenyl, alkynyl, or aryl group). The hydrocarbon group may be a monovalent group or a group having a valence of greater than one (e.g., di-, tri-, or tetravalence) formed by removal of a, e.g., one or more, hydrogen atoms from alkane, alkene, alkyne, or arene. In the hydrocarbon or hydrocarbon group, a, e.g., at least one, methylene may be replaced by an oxide moiety, a carbonyl moiety, an ester moiety, —NH—, or a combination thereof. Unless otherwise stated to the contrary, the hydrocarbon compound or hydrocarbon group (alkyl, alkenyl, alkynyl, or aryl) may have 1 to 60, 2 to 32, 3 to 24, or 4 to 12 carbon atoms.

As used herein, when a definition is not otherwise provided, "alkyl" refers to a linear or branched saturated monovalent hydrocarbon group (methyl, ethyl hexyl, etc.). Unless specified otherwise, an alkyl group has from 1 to 50 carbon atoms, or 1 to 18 carbon atoms, or 1 to 12 carbon atoms.

As used herein, when a definition is not otherwise provided, "alkenyl" refers to a linear or branched monovalent hydrocarbon group having a carbon-carbon double bond. Unless specified otherwise, an alkenyl group has from 2 to 50 carbon atoms, or 2 to 18 carbon atoms, or 2 to 12 carbon atoms.

As used herein, when a definition is not otherwise provided, "alkynyl" refers to a linear or branched monovalent hydrocarbon group having a carbon-carbon triple bond. Unless specified otherwise, an alkenyl group has from 2 to 50 carbon atoms, or 2 to 18 carbon atoms, or 2 to 12 carbon atoms.

As used herein, when a definition is not otherwise provided, "aryl" refers to a group formed by removal of a, e.g., at least one, hydrogen from an arene (e.g., a phenyl or naphthyl group). Unless specified otherwise, an aryl group has from 6 to 50 carbon atoms, or 6 to 18 carbon atoms, or 6 to 12 carbon atoms. As used herein, when a definition is not otherwise provided, "hetero" refers to including 1 to 3 heteroatoms, e.g., N, O, S, Si, P, or a combination thereof.

As used herein, when a definition is not otherwise provided, "alkoxy" refers to an alkyl group linked to oxygen (e.g., alkyl-O—) for example, a methoxy group, an ethoxy group, or a sec-butyloxy group.

As used herein, when a definition is not otherwise provided, "amine" group is a group represented by —NRR, (R is each independently hydrogen, a C1-C12 alkyl group, a C7-C20 alkylarylene group, a C7-C20 arylalkylene group, or a C6-C18 aryl group.

As used herein, the upper and lower endpoints set forth for various values may be independently combined to provide a range.

As used herein, the expression "not including cadmium (or other harmful heavy metal)" may refer to the case in which a concentration of each of cadmium (or another heavy metal deemed harmful) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other heavy metal) may be present or, if present, an amount of cadmium (or other heavy metal) may be less than or equal to a detection limit or as an impurity level of a given analysis tool (e.g., by inductively coupled plasma atomic emission spectroscopy).

As used herein, the term "chalcogen" is inclusive of sulfur (S), selenium (Se), and tellurium (Te), and does not include oxygen (O).

As used herein, the term "Group" may refer to a group of Periodic Table.

As used herein, "Group I" refers to Group IA and Group IB, and examples may include Li, Na, K, Rb, and Cs, but are not limited thereto.

As used herein, "metal" includes a semi-metal such as Si.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group IIIA metal may be Al, In, Ga, and TI, and examples of Group IIIB may be scandium, yttrium, or the like, but are not limited thereto.

As used herein, "Group IV" refers to Group IVA and Group IVB, and examples of a Group IVA metal may be Si, Ge, and Sn, and examples of Group IVB metal may be titanium, zirconium, hafnium, rutherfordium, or the like, but are not limited thereto.

As used herein, "Group V" includes Group VA and includes nitrogen, phosphorus, arsenic, antimony, and bismuth, but is not limited thereto.

As used herein, "Group VI" includes Group VIA and includes sulfur, selenium, and tellurium, but is not limited thereto.

As used herein, the wording quantum efficiency may be used interchangeably with a quantum yield. In an embodiment, the quantum efficiency may be a relative quantum yield or an absolute quantum yield, for example, which can be readily measured by any suitable equipment. The quantum efficiency (or quantum yield) may be measured in a solution state or a solid state (in a composite). In an embodiment, "quantum yield (or quantum efficiency)" may be a ratio of photons emitted to photons absorbed, e.g., by a nanostructure or population of nanostructures. In an embodiment, the quantum efficiency may be determined by any suitable method. For example, there may be two methods for measuring the fluorescence quantum yield or efficiency: the absolute method and the relative method.

The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on their PL wavelengths, but are not limited thereto.

As used herein, a nanostructure or a nanoparticle is a structure having a, e.g., at least one, region or characteristic dimension with a dimension of less than or equal to about 500 nm. In an embodiment, a dimension (or an average) of the nanostructure is less than or equal to about 300 nm, less than or equal to about 250 nm, less than or equal to about 150 nm, less than or equal to about 100 nm, less than or equal to about 50 nm, or less than or equal to about 30 nm. In an embodiment, the structure may have any suitable shape. The nanostructure may include a nanowire, a nanorod, a nanotube, a branched nanostructure, a nano tetrapod, a nanotripod, a nanobipod, a nanocrystal, a nanodot, a multi-pod type shape such as at least two pods, or the like and is not limited thereto. The nanostructure or the nanoparticle can be, e.g., substantially crystalline, substantially monocrystalline, polycrystalline, (for example, at least partially) amorphous, or a combination thereof.

In an embodiment, a semiconductor nanoparticle such as a quantum dot may exhibit quantum confinement or exciton confinement. As used herein, the term "quantum dot" or "semiconductor nanoparticle" is not limited in a shape thereof unless otherwise defined. A semiconductor nanoparticle such as a quantum dot may have a size smaller than a Bohr excitation diameter for a bulk crystal material having an identical composition and may exhibit a quantum confinement effect. The semiconductor nanoparticle or the quantum dot may emit light corresponding to a bandgap energy thereof by controlling a size of a nanocrystal acting as an emission center thereof.

Unless mentioned to the contrary, a numerical range recited herein is an inclusive one.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, ±5%, ±3%, or ±1% of the stated value.

As used herein, the average (value) may be mean or median. In an embodiment, the average (value) may be a mean average.

A semiconductor nanocrystal may be used as a light emitting material in various fields, e.g., applications, for example, a display device, an energy device, or a bio light emitting device. Luminescent nanostructures including a semiconductor nanocrystal and exhibiting a desirable electroluminescent property may contain a harmful heavy metal such as cadmium (Cd), lead, mercury, or a combination thereof. Accordingly, it is desirable to provide a light emitting device or a display device having a light emitting layer substantially free of a harmful heavy metal.

Cadmium free semiconductor nanoparticles may include indium phosphide or a zinc chalcogenide as an emission center. The zinc chalcogenide may exhibit an ionic bond feature stronger in comparison with an indium phosphide and may achieve improved optical properties for the nanoparticles emitting light of a desired wavelength (e.g., blue light).

The present inventors have found that zinc chalcogenide nanoparticles emitting blue light may be improved for example in terms of strengthening of a quantum confinement effect. Without wishing to be bound by any theory, it is believed that zinc chalcogenide nanoparticles emitting blue light may have an intrinsic bandgap wider than that of indium phosphide based nanoparticles, and it may be diffi- cult to provide an enhanced confinement structure. In order to address this issue, it is desired to provide a nanoparticle having a composition that has a desirable lattice constant and at the same time allow an effective confinement.

In an embodiment, accordingly, the nanoparticle includes a magnesium chalcogenide, which is based on a Group IIA-VIB compound. A crystalline material including the magnesium chalcogenide can be prepared mainly by using a physical deposition such as a molecular beam epitaxy (MBE). Without wishing to be bound by any theory, it is believed that a Mg-chalcogenide (sulfide, selenide, telluride, or a combination thereof) may provide an effective confine- ment for a core (for example, a zinc selenide based core) and an appropriate lattice parameter. The present inventors have found that magnesium chalcogenide nanoparticles may include an oxide or a hydroxide compound due to the strong oxophilic property of magnesium, the main metal of the particle. Wet chemical methods for producing the semicon- ductor nanoparticles may involve using a ligand compound and an organic solvent, and the present inventors have also found that the oxophilic properties of the magnesium may make it difficult to provide a magnesium chalcogenide semiconductor nanoparticle substantially free of a magne- sium-oxygen bond. Therefore, without wishing to be bound by any theory, it is believed that the magnesium chalco- genide based nanoparticles may include an oxide or hydrox- ide (e.g., a magnesium oxide or a magnesium hydroxide). In other words, without wishing to be bound by any theory, it is believed that magnesium chalcogenide based nanopar- ticles may exhibit a peak assigned to a magnesium linked to oxygen as confirmed by an X-ray photoelectron spectros- copy analysis and exhibit a magnesium oxide peak or a magnesium hydroxide peak in an X-ray diffraction spec- trum.

Surprisingly, the present inventors have found that the method of an embodiment described herein may effectively suppress or prevent the formation of a magnesium-oxygen bond (or an occurrence of an oxygen related side reaction). According to the method of an embodiment, a chemical wet process may provide a semiconductor nanoparticle that includes a magnesium chalcogenide and is substantially free of the oxygen-magnesium bond or includes only a very limited amount of the oxygen-magnesium bond. In an embodiment, the semiconductor nanoparticles including the magnesium chalcogenide may not include a compound based on a magnesium-oxygen bond (e.g., a magnesium oxide, a magnesium hydroxide, or the like), for example, as determined by an appropriate analysis tool such as an X-ray diffraction spectroscopy analysis or an X-ray photoelectron spectroscopy analysis.

In an embodiment, a method of producing a semiconduc- tor nanoparticle includes: combining (e.g., contacting) a magnesium precursor and an additive with a chalcogen precursor in a reaction medium including an organic solvent and an organic ligand; heating the reaction medium at a reaction temperature; and conducting a reaction between the magnesium precursor and the chalcogen precursor in the presence of the additive to form a magnesium chalcogenide. The method may include preparing the magnesium precur- sor and the additive.

The additive includes a hydride compound including an alkali metal, calcium, barium, aluminum, or a combination thereof. The semiconductor nanoparticle prepared by the method of an embodiment include a magnesium chalco- genide and the magnesium chalcogenide includes magne- sium; and selenium, sulfur, or a combination thereof. In an embodiment, the semiconductor nanoparticles may not include cadmium. In an embodiment, the semiconductor nanoparticles may not include a toxic heavy metal such as lead, mercury, or the like.

In an embodiment, the magnesium precursor may include a magnesium powder, a substituted or unsubstituted C1 to C30 alkylated magnesium such as dimethyl magnesium, diethyl magnesium, methyl ethyl magnesium, ethyl propyl magnesium, dipropyl magnesium, or the like, a substituted or unsubstituted C2 to C30 alkenylated magnesium, a sub- stituted or unsubstituted C6 to C50 arylated magnesium such as diphenyl magnesium, phenyl alkyl magnesium, dibenzyl magnesium, benzyl alkyl magnesium, or the like, a substi- tuted or unsubstituted magnesium halide such as magnesium chloride, magnesium bromide, magnesium fluoride, magne- sium iodide, benzyl magnesium chloride, benzyl magnesium bromide, or the like, a C1 to C30 magnesium cyanide, a magnesium sulfate ($MgSO_4$), a magnesium sulfonate ($MgSO_3$), a magnesium nitrate ($Mg(NO_3)$), or a combination thereof.

The magnesium precursor may be added after being mixed with an amine compound. The amine compound may be a substituted or unsubstituted C1 to C30 hydrocarbon group. In the amine compound, the number of the substi- tuted or unsubstituted C1 to C30 hydrocarbon group may be greater than or equal to about 1 (e.g., 1, 2, or 3). The amine compound may be a primary amine, a secondary amine, or a tertiary amine. The hydrocarbon included in the amine compound may be an aliphatic hydrocarbon, an aromatic hydrocarbon, or a combination thereof. In an embodiment, the amine compound may not include oxygen (e.g., an oxygen atom in a molecular structure thereof or an oxygen molecule). In an embodiment, the amine compound may be the same compound as the organic ligand included in the reaction medium. The amine compound may include (or may be) oleyl amine.

The additive may include a hydride compound including an alkali metal, calcium, barium, aluminum, or a combina- tion thereof. Surprisingly, the present inventors have found that by adding the magnesium precursor and the additive to the reaction medium and conducting a reaction between the magnesium precursor with a chalcogen precursor in the presence of the additive, the formation of the Mg—O or Mg—OH may be prevented or suppressed.

The hydride compound may further include a substituted or unsubstituted $C_{1-50}$ hydrocarbon group such as a substi- tuted or unsubstituted $C_{1-50}$ (e.g., $C_{5-20}$) aliphatic hydrocar- bon group, a substituted or unsubstituted $C_{6-50}$ (e.g., $C_{8-30}$) aromatic hydrocarbon group (a phenyl group, a naphthyl group, or the like), or a combination thereof, boron, or a combination thereof. The hydride compound may further include an alkaline earth metal. The $C_{1-50}$ aliphatic hydro- carbon group may include a methyl group, an ethyl group, a propyl group, an isopropyl group, a butyl group, an isobutyl group, a pentyl group, an isopentyl group, a hexyl group, a heptyl group, an octyl group, or a nonyl group.

The hydride compound may include an alkali metal, an alkaline earth metal, aluminum, or a combination thereof. The hydride compound may include a lithium containing hydride compound, a potassium-containing hydride com- pound, an aluminum-containing hydride compound, a sodium-containing hydride compound, a lithium aluminum hydride compound, or a combination thereof.

In addition to the hydride compound, the additive may further include a metallic material. The types of the metallic material may include a metallic sodium, a metallic potassium, a metallic lithium, a metallic calcium, a metallic barium, a metallic aluminum, or a combination thereof.

An example of the additive may include a substituted or unsubstituted (mono-, di-, or tri-)alkyl alkali metal borohydride, a substituted or unsubstituted (mono-, di-, or tri-) alkenyl alkali metal borohydride, a substituted or unsubstituted (mono-, di-, tri-) alkyl alkenyl alkali metal borohydride, a substituted or unsubstituted (mono-, di-, or tri-)aryl alkali metal borohydride, a substituted or unsubstituted alkyl aryl alkali metal borohydride, a substituted or unsubstituted alkali metal (e.g., lithium, sodium, potassium) aluminum hydride, a substituted or unsubstituted aluminum hydride, alkali metal (lithium, sodium, potassium) borohydride, alkali metal (lithium, sodium, potassium) hydride, or a combination thereof. The additive may include a lithium aluminum hydride, a lithium triethylborohydride (lithium triethylborohydride), $NaBH_4$, Diisobutylaluminum hydride (DIBAL-H), or a combination thereof.

The method may further include adding a $C_{6-50}$ aromatic phosphine compound to the reaction medium. The $C_{6-50}$ aromatic phosphine compound may include an aryl phosphine compound, a diaryl phosphine compound, a triaryl phosphine compound, or a combination thereof. The aromatic phosphine compound may be added with the additive (e.g., may be mixed with the additive and then be added) to the reaction medium. In an embodiment, the additive may be included in the aromatic phosphine compound and added to the reaction medium. Without wishing to be bound by any theory, it is believed that the combination of the additive with the aromatic phosphine compound may effectively suppress the formation of the oxide. The additive may be added to the reaction medium simultaneously with the chalcogen precursor (e.g., for example, as mixed with the chalcogen precursor) or separately to the chalcogen precursor.

The reaction medium may include an organic solvent, an organic ligand, or a combination thereof. The organic solvent may be a C1 to C50 amine (for example, a C6 to C30 primary amine such as a hexadecylamine, a C6 to C30 secondary amine such as dioctylamine, a C6 to C40 tertiary amine such as a trioctyl amine), a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine compound substituted with a, e.g., at least one, (e.g., 1, 2, or 3) C6 to C22 alkyl group (e.g., trioctyl phosphine), a primary, secondary, or tertiary phosphine oxide (e.g., trioctylphosphine oxide) substituted with a (e.g., 1, 2, or 3) C6 to C22 alkyl group(s), a C12 to C22 aromatic ether such as a phenyl ether or a benzyl ether, or a combination thereof. In an embodiment, the organic solvent may not include an oxygen-containing moiety in its chemical structure thereof. A combination including more than one type of organic solvent may be used. The organic solvent may include a C3 to C80 (e.g., C10 to C40) tertiary amine compound such as trioctyl amine, a C2 to C80 (C10 to C40) alkene compound, or a combination thereof.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR, $RPO(OH)_2$, $R_2POOH$, or a combination thereof, wherein each R is the same or different and is each independently hydrogen, a substituted or unsubstituted C1 to C40 (or C3 to C24) aliphatic hydrocarbon group, a substituted or unsubstituted C6 to C40 (or C6 to C24) aromatic hydrocarbon group, or a combination thereof. In an embodiment, the organic ligand may not include oxygen or an oxygen moiety in a chemical structure thereof.

The organic solvent and the organic ligand may be de-oxygenated and then used.

Examples of the organic ligand compound may include methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butane amine, pentane amine, hexane amine, octane amine, dodecane amine, hexadecyl amine, oleyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, stearic acid; a phosphine such as methyl phosphine, ethyl phosphine, propyl phosphine, butyl phosphine, pentyl phosphine, tributylphosphine, or trioctylphosphine; a phosphine oxide such as methyl phosphine oxide, ethyl phosphine oxide, propyl phosphine oxide, butyl phosphine oxide, or trioctylphosphine oxide; a diphenyl phosphine or triphenyl phosphine compound, or an oxide compound thereof; phosphonic acid, or the like, but are not limited thereto. One or more organic ligand compounds may be used. In an embodiment, the organic ligand compound may be a combination of RCOOH and amine, e.g., $RNH_2$, $R_2NH$, $R_3N$, or a combination thereof, wherein R is as defined herein.

The chalcogen precursor may include an organic solvent dispersion of selenium, an organic solvent dispersion of sulfur, a thiol compound, a bis(trialkylsilyl alkyl) sulfide (e.g., bistrimethylsilyl methyl sulfide), a bis(trialkylsilyl) sulfide (e.g., bistrimethylsilyl sulfide), an ammonium sulfide, a sodium sulfide, an organic solvent dispersion of tellurium, or a combination thereof.

In an embodiment, an organic solvent for the chalcogen precursor may include a phosphine solvent, an amine solvent, an aliphatic hydrocarbon solvent, an aromatic hydrocarbon solvent, or a combination thereof. In an embodiment, the chalcogen precursor may include selenium-trioctylphosphine (Se-TOP), selenium-tributylphosphine (Se-TBP), selenium-triphenylphosphine (Se-TPP), selenium-diphenylphosphine (Se-DPP), tellurium-trioctylphosphine (Te-TOP), tellurium-tributylphosphine (Te-TBP), tellurium-triphenylphosphine (Te-TPP), tellurium-diphenyl phosphine (Te-DPP), hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), a bis(trialkylsilyl) sulfide (e.g., bis(trimethylsilyl) sulfide), a bis(trialkylsilyl)alkyl sulfide (e.g., bis(trimethylsilyl) methylsulfide, ammonium sulfide, sodium sulfide, or a combination thereof.

In an embodiment, the chalcogen precursor may include a selenium precursor (e.g., a selenium compound). In an embodiment, the reaction medium may not include an oxygen containing moiety. In an embodiment, the reaction medium (e.g., the organic solvent and/or the organic ligand) may be substantially free of an oxygen molecule. In an embodiment, the expression "substantially free" (e.g., of oxygen) may refer to the case in which a concentration of oxygen may be less than or equal to about 100 ppmw, less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, no amount of oxygen may be present or, if present, an amount of oxygen, magnesium oxide, or magnesium hydroxide may be less than or equal to a detection limit or as an impurity level of a given analysis tool (e.g., by inductively coupled plasma atomic emission spectroscopy).

The reaction medium may be pre-treated (e.g., heated under vacuum) prior to the addition of the magnesium precursor, the additive, or the chalcogen precursor.

By the pre-treatment, water, oxygen, or a combination thereof present in the reaction medium may be eliminated. A temperature and a time for the pre-treatment is not particularly limited and selected appropriately. In an embodiment, the pretreatment may be conducted at a temperature of greater than or equal to about 50° C., greater than or equal to about 60° C., greater than or equal to about 70° C., greater than or equal to about 80° C., or greater than or equal to about 90° C. and less than or equal to about 200° C., less than or equal to about 190° C., less than or equal to about 180° C., less than or equal to about 170° C., less than or equal to about 160° C., less than or equal to about 150° C., less than or equal to about 140° C., less than or equal to about 130° C., less than or equal to about 120° C., or less than or equal to about 110° C. The time for the pre-treatment may be greater than or equal to about 1 minutes, greater than or equal to about 10 minutes, greater than or equal to about 30 minutes, greater than or equal to about 50 minutes, and less than or equal to about 10 hours, less than or equal to about 5 hours, or less than or equal to about 2 hours.

In a method of an embodiment, the magnesium precursor may be added to the reaction medium simultaneously with the additive or after the addition of the additive. In an embodiment, the magnesium precursor and the additive may be added to the reaction medium (e.g., a hot reaction medium) in a heated state. Without wishing to be bound by any theory, it is believed that adding the magnesium for example, simultaneously with the additive or after the addition of the additive, to the reaction medium at a relatively high temperature may further help suppressing or preventing the formation of the magnesium-oxygen bond. The temperature at which the magnesium precursor (optionally with the additive) to the reaction medium may be greater than or equal to about 150° C., greater than or equal to about 180° C., greater than or equal to about 200° C., greater than or equal to about 220° C., or greater than or equal to about 250° C. The temperature at which the magnesium precursor (optionally with the additive) to the reaction medium may be less than or equal to about 400° C., less than or equal to about 380° C., less than or equal to about 350° C., less than or equal to about 330° C., less than or equal to about 310° C., less than or equal to about 290° C., or less than or equal to about 280° C. The temperature at which the magnesium precursor (optionally with the additive) to the reaction medium may be less than or equal to about a reaction temperature between the magnesium precursor and the chalcogen precursor. The temperature at which the magnesium precursor (optionally with the additive) to the reaction medium may be the same as the reaction temperature. The temperature at which the magnesium precursor (optionally with the additive) to the reaction medium may be higher than the reaction temperature.

In an embodiment, the reaction medium, the precursor, the additive, or a combination thereof may be substantially free of an oxygen (e.g., an oxygen molecule) or an oxygen containing moiety (for example, in a chemical structure thereof).

In an embodiment, the method further includes adding the zinc precursor to the reaction medium after the initiation of the reaction (for example, during when the reaction proceeds).

The zinc precursor may include a zinc (metal) powder, a zinc oxide, a hydrocarbyl zinc compound (e.g., C2 to C30 dialkyl zinc such as dimethyl zinc, diethyl zinc, ethyl methyl zinc, ethylpropyl zinc, methyl propyl zinc, diisobutyl zinc, a C2-C20 alkenyl zinc, a C2 to C20 alkynyl zinc, or a combination thereof), a Zn alkoxide (e.g., a zinc ethoxide), a zinc acetate, a Zn carboxylate (e.g., a zinc fatty acid ester such as zinc stearate, zinc, oleate, or the like), a Zn nitrate, a Zn perchlorate, a Zn sulfate, a Zn acetylacetonate, a Zn halide (e.g., a zinc chloride), a Zn cyanide, a Zn hydroxide, zinc carbonate, or a combination thereof.

In an embodiment, the reaction medium may further include a particle including semiconductor nanocrystal core, and the magnesium chalcogenide may be formed on a surface of the particle. In a method of an embodiment, the semiconductor nanoparticle may include a semiconductor nanocrystal core and a semiconductor nanocrystal shell disposed on the semiconductor nanocrystal core, and the semiconductor nanocrystal shell may include the magnesium chalcogenide.

In an embodiment, the semiconductor nanocrystal core may include a zinc chalcogenide. The semiconductor nanocrystal core or the zinc chalcogenide may include a zinc selenide, a zinc telluride, a zinc sulfide, a zinc selenide sulfide, a zinc telluride selenide, a zinc telluride sulfide, a zinc selenide telluride sulfide, or a combination thereof. In an embodiment, the semiconductor nanocrystal core may include or may not include an indium phosphide, an indium zinc phosphide, an indium gallium phosphide, or a combination thereof.

If present, a size of the semiconductor nanocrystal core may be selected appropriately. A size of the semiconductor nanocrystal core may be greater than or equal to about 1 nm, greater than or equal to about 1.5 nm, greater than or equal to about 2 nm, greater than or equal to about 2.5 nm, greater than or equal to about 3 nm, greater than or equal to about 3.5 nm, greater than or equal to about 4 nm, greater than or equal to about 5 nm, greater than or equal to about 6 nm, greater than or equal to about 7 nm, greater than or equal to about 8 nm, or greater than or equal to about 9 nm. In an embodiment, a size of the semiconductor nanocrystal core may be less than or equal to about 20 nm, less than or equal to about 15 nm, less than or equal to about 10 nm, less than or equal to about 9 nm, less than or equal to about 8 nm, less than or equal to about 7 nm, less than or equal to about 6 nm, less than or equal to about 5 nm, less than or equal to about 4 nm, less than or equal to about 3 nm, or less than or equal to about 2 nm.

In a method of an embodiment, an amount of the additive as used may be, per one mole of magnesium (e.g., the magnesium precursor), greater than or equal to about 0.05 moles, greater than or equal to about 0.1 moles, greater than or equal to about 0.15 moles, greater than or equal to about 0.2 moles, greater than or equal to about 0.23 moles, greater than or equal to about 0.25 moles, greater than or equal to about 0.3 moles, greater than or equal to about 0.4 moles, greater than or equal to about 0.5 moles, greater than or equal to about 0.55 moles, greater than or equal to about 0.6 moles, greater than or equal to about 0.65 moles, greater than or equal to about 0.7 moles, greater than or equal to about 0.75 moles, greater than or equal to about 1 moles, greater than or equal to about 1.25 moles, greater than or equal to about 1.5 moles, greater than or equal to about 1.75 moles, greater than or equal to about 2 moles, greater than or equal to about 2.5 moles, greater than or equal to about 3 moles, greater than or equal to about 3.5 moles, greater than or equal to about 4 moles, greater than or equal to about 4.5 moles, or greater than or equal to about 5 moles. In a method of an embodiment, an amount of the additive as used may be, per one mole of magnesium (e.g., the magnesium precursor), less than or equal to about 20 moles, less than or equal to about 19 moles, less than or equal to about 18 moles, less than or equal to about 17 moles, less than or equal to about 16 moles, less than or equal to about 15 moles, less than or equal to about 14 moles, less than or equal to about 13 moles, less than or equal to about 12 moles, less than or equal to about 11 moles, less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, less than or equal to about 2 moles, less than or equal to about 1.5 moles, less than or equal to about 1 moles, or less than or equal to about 0.5 moles.

In a method of an embodiment, an amount of the chalcogen precursor as used may be, per one mole of magnesium (e.g., the magnesium precursor), greater than or equal to about 0.1 moles, greater than or equal to about 0.2 moles, greater than or equal to about 0.3 moles, greater than or equal to about 0.4 moles, greater than or equal to about 0.5 moles, greater than or equal to about 0.6 moles, greater than or equal to about 0.7 moles, greater than or equal to about 0.9 moles, greater than or equal to about 1 moles, greater than or equal to about 1.2 moles, greater than or equal to about 1.4 moles, greater than or equal to about 1.6 moles, greater than or equal to about 1.8 moles, or greater than or equal to about 2 moles. In a method of an embodiment, an amount of the chalcogen precursor as used may be, per one mole of magnesium (e.g., the magnesium precursor), less than or equal to about 20 moles, less than or equal to about 15 moles, less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, less than or equal to about 2 moles, less than or equal to about 1 moles, or less than or equal to about 0.5 moles.

In a method of an embodiment, a mole ratio of the additive to the chalcogen precursor may be greater than or equal to about 0.3:1, greater than or equal to about 0.5:1, greater than or equal to about 0.7:1, greater than or equal to about 0.9:1, greater than or equal to about 1:1, greater than or equal to about 1.1:1, greater than or equal to about 1.2:1, greater than or equal to about 1.3:1, greater than or equal to about 1.4:1, or greater than or equal to about 1.5:1, and less than or equal to about 10:1, less than or equal to about 7:1, less than or equal to about 5:1, less than or equal to about 3:1, or less than or equal to about 2:1.

In an embodiment, the amounts of the organic ligand, the amine compound, the aromatic phosphine compound, or a combination thereof may be selected appropriately.

In a method of an embodiment, an amount of the organic ligand, the amine compound, or both of the organic ligand and the amine compound in the reaction medium may be, per one mole of magnesium (e.g., the magnesium precursor), greater than or equal to about 0.05 moles, greater than or equal to about 0.1 moles, greater than or equal to about 0.5 moles, greater than or equal to about 1 moles, greater than or equal to about 1.25 moles, greater than or equal to about 1.5 moles, greater than or equal to about 1.75 moles, greater than or equal to about 2 moles, greater than or equal to about 2.25 moles, greater than or equal to about 2.5 moles, greater than or equal to about 3 moles, greater than or equal to about 3.5 moles, greater than or equal to about 4 moles, greater than or equal to about 4.5 moles, greater than or equal to about 5 moles, greater than or equal to about 5.5 moles, greater than or equal to about 6 moles, or a combination thereof. In a method of an embodiment, an amount of the organic ligand, the amine compound, or both of the organic ligand and the amine compound in the reaction medium may be, per one mole of magnesium (e.g., the magnesium precursor), less than or equal to about 30 moles, less than or equal to about 25 moles, less than or equal to about 20 moles, less than or equal to about 17.5 moles, less than or equal to about 15 moles, less than or equal to about 12.5 moles, less than or equal to about 10 moles, less than or equal to about 9.5 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, less than or equal to about 2 moles, or less than or equal to about 1 mole.

In a method of an embodiment, an amount of the aromatic phosphine compound in the reaction medium may be, per one mole of magnesium (e.g., the magnesium precursor), greater than or equal to about 0.1 moles, greater than or equal to about 0.2 moles, greater than or equal to about 0.23 moles, greater than or equal to about 0.25 moles, greater than or equal to about 0.5 moles, greater than or equal to about 0.75 moles, greater than or equal to about 1 mole, greater than or equal to about 1.25 moles, greater than or equal to about 1.5 moles, greater than or equal to about 1.75 moles, greater than or equal to about 2 moles, greater than or equal to about 2.5 moles, greater than or equal to about 3 moles, greater than or equal to about 3.5 moles, greater than or equal to about 4 moles, greater than or equal to about 4.5 moles, or greater than or equal to about 5 moles. In a method of an embodiment, an amount of the aromatic phosphine compound in the reaction medium may be, per one mole of magnesium (e.g., the magnesium precursor), less than or equal to about 20 moles, less than or equal to about 19 moles, less than or equal to about 18 moles, less than or equal to about 17 moles, less than or equal to about 16 moles, less than or equal to about 15 moles, less than or equal to about 14 moles, less than or equal to about 13 moles, less than or equal to about 12 moles, less than or equal to about 11 moles, less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, less than or equal to about 2 moles, or less than or equal to about 1.5 moles.

The reaction temperature may be controlled taking into consideration types of the precursors, a desired size of a particle, or the like. The reaction temperature may be greater than or equal to about 200° C., greater than or equal to about 230° C., greater than or equal to about 250° C., greater than or equal to about 280° C., greater than or equal to about 290° C., or greater than or equal to about 300° C. The reaction temperature may be less than or equal to about 400° C., less than or equal to about 380° C., less than or equal to about 370° C., less than or equal to about 360° C., less than or equal to about 350° C., less than or equal to about 340° C., less than or equal to about 330° C., less than or equal to about 320° C., less than or equal to about 300° C., or less than or equal to about 310° C.

A time for the reaction may be controlled taking into consideration a size or a composition of a resulting particle and is not particularly limited. The time for the reaction may be greater than or equal to about 1 minute, greater than or equal to about 5 minutes, greater than or equal to about 10 minutes, greater than or equal to about 15 minutes, greater than or equal to about 20 minutes, greater than or equal to about 30 minutes, or greater than or equal to about 40 minutes. The reaction time may be less than or equal to about 10 hours, less than or equal to about 5 hours, less than or equal to about 3 hours, less than or equal to about 2 hours, or less than or equal to about 1 hour.

The method may further include conducting a reaction between a metal precursor (for example, a zinc precursor) and a non-metal precursor (for example, a chalcogen precursor) in the presence of a first particle including the semiconductor nanocrystal core and optionally the semiconductor nanocrystal shell (for example including the magnesium chalcogenide) to form an additional semiconductor nanocrystal layer (e.g., an inner shell layer, an outer shell layer, or a combination thereof, hereinafter, can be referred to as "additional shell" at times). The zinc precursor and the chalcogen precursor for the formation of the additional shell are the same as described herein. The formation of the additional shell may be carried out in the presence of the organic ligand and the organic solvent. Prior to forming the additional shell, the first particle may be separated out (or removed) from a reaction mixture. A time and a temperature for the formation of the additional shell may be the same as described for the time and the temperature for the reaction. By the formation of the additional shell, a core shell structured semiconductor particle or a core-multishell structured semiconductor particle may be prepared.

In an embodiment, the core shell structured semiconductor nanoparticle or the core multishell structured semiconductor nanoparticle may include $Mg(Zn)Se/ZnSe_xS_{1-x}/ZnS$, $Mg_yZn_{1-y}Se/ZnSe_xS_{1-x}/ZnS$, $Mg_yZn_{1-y}S/ZnSe_xS_{1-x}/ZnS$, $ZnSe_aTe_{1-a}/Mg_yZn_{1-y}Se$, $ZnSe_aTe_{1-a}/Mg_yZn_{1-y}S$, $ZnSe_a$ $Te_{1-a}/ZnSe_xS_{1-x}/Mg_yZn_{1-y}Se/ZnSe_xS_{1-x}$, $ZnSe_aTe_{1-a}/$ $Mg_yZn_{1-y}Se/ZnSe_xS_{1-x}$, or a combination thereof (wherein, a is greater than or equal to about 0, greater than or equal to about 0.0001, or greater than or equal to about 0.001, and less than or equal to about 1, less than or equal to about 0.5, less than or equal to about 0.1, or less than or equal to about 0.08, y is greater than 0 and less than or equal to about 1, and x is greater than or equal to 0 and less than or equal to about 1). In an embodiment, the core shell structured semiconductor nanoparticle or the core multishell structured semiconductor nanoparticle may include ZnMgSe/ZnSe/ZnS/ZnMgSe.

In an embodiment, the semiconductor nanoparticle may include a semiconductor nanocrystal particle (or core) including (a zinc chalcogenide including) zinc, tellurium, sulfur, and selenium, and a first shell layer including a magnesium chalcogenide (or a zinc magnesium chalcogenide). A second shell layer including a zinc sulfide may be disposed on the first shell layer.

After the completion of the reaction, a non-solvent is added to reaction products and the semiconductor nanoparticle coordinated with, e.g., bound to, the ligand compound may be separated. The non-solvent may be a polar solvent that is miscible with the solvent used in the core formation reaction, the shell formation reaction, or a combination thereof and is not capable of dispersing the produced nanocrystals therein. The non-solvent may be selected depending on the solvent used in the reaction and may be, for example, acetone, ethanol, butanol, isopropanol, water, tetrahydrofuran (THF), dimethylsulfoxide (DMSO), diethylether, formaldehyde, acetaldehyde, ethylene glycol, a solvent having a similar solubility parameter to the foregoing non-solvents, or a combination thereof. Separation of the nanocrystal particles may involve centrifugation, sedimentation, chromatography, or distillation. The separated nanocrystal particles may be added to a washing solvent and washed, if desired. The washing solvent is not particularly limited and a solvent having similar solubility parameter to that of the ligand may be used and examples thereof may include hexane, heptane, octane, chloroform, toluene, benzene, or the like.

The semiconductor nanoparticles of the embodiment may not be dispersible in water, any of the foregoing listed non-solvents, a mixture thereof, or a combination thereof. The semiconductor nanoparticles of the embodiment may be water-insoluble.

The semiconductor nanoparticles of the embodiments following separation from the reaction solvent and reaction components may be dispersed in an aforementioned organic solvent. In an embodiment, the semiconductor nanoparticles may be dispersed in a substituted or unsubstituted C6 to C40 aliphatic hydrocarbon, a substituted or unsubstituted C6 to C40 aromatic hydrocarbon, or a mixture thereof.

In an embodiment, the semiconductor nanoparticle prepared in the method of an embodiment is (are) provided. The semiconductor nanoparticle may include a magnesium chalcogenide that includes magnesium; and selenium, sulfur, tellurium, or a combination thereof. The semiconductor nanoparticle may further include aluminum, an alkali metal, boron, or a combination thereof. The semiconductor nanoparticle may further include an alkaline earth metal other than the magnesium. As used herein, the wording "semiconductor nanoparticle" may refer to a single semiconductor nanoparticle, a population of the semiconductor nanoparticles, or a combination thereof. The semiconductor nanoparticle and the magnesium chalcogenide may be substantially free of a magnesium oxide, a magnesium hydroxide, or a combination thereof, for example, determined by an appropriate analysis tool (e.g., an XPS).

In an embodiment, the magnesium chalcogenide may include a magnesium selenide, a magnesium sulfide, a magnesium telluride, a magnesium selenide sulfide, a magnesium selenide telluride, a magnesium telluride sulfide, a zinc magnesium selenide, a zinc magnesium sulfide, a zinc magnesium telluride, a zinc magnesium selenide sulfide, a zinc magnesium selenide telluride, a zinc magnesium telluride sulfide, or a combination thereof.

In an embodiment, the magnesium chalcogenide or the semiconductor nanoparticle, as determined by an X-ray photoelectron spectroscopy analysis, may not include or exhibit a peak for a magnesium oxide, a magnesium hydroxide, or a combination thereof. In an embodiment, the magnesium chalcogenide or the semiconductor nanoparticle may be substantially free of a magnesium oxide, a magnesium hydroxide, or a combination thereof.

In an embodiment, the semiconductor nanoparticle, as determined by an X-ray photoelectron spectroscopy analysis, may exhibit a peak assigned to the magnesium (e.g., a peak for Mg2P) at a binding energy of greater than or equal to about 50 eV, greater than or equal to about 50.05 eV, greater than or equal to about 50.1 eV, greater than or equal to about 50.2 eV, greater than or equal to about 50.3 eV, greater than or equal to about 50.4 eV, greater than or equal to about 50.5 eV, greater than or equal to about 50.6 eV, greater than or equal to about 50.7 eV, greater than or equal to about 50.8 eV, greater than or equal to about 50.9 eV, or greater than or equal to about 51 eV. In an embodiment, the semiconductor nanoparticle, as determined by an X-ray photoelectron spectroscopy analysis, may exhibit a peak assigned to the magnesium (e.g., a peak for Mg2P) at a binding energy of less than or equal to about 55 eV, less than or equal to about 54 eV, less than or equal to about 53 eV, less than or equal to about 52 eV, or less than or equal to about 51 eV. In the X-ray photoelectron spectrum of the semiconductor nanoparticle, the curve or line assigned for the magnesium (Mg) (e.g., a peak for Mg2p) may be based on substantially only the magnesium-selenium bond. In an embodiment, the semiconductor nanoparticle may not exhibit, in an XPS analysis thereof, a peak for a magnesium for the magnesium-oxygen bond. In an embodiment, the semiconductor nanoparticle may exhibit, in an XPS analysis thereof, an intensity ratio of a magnesium peak (Mg2p) to a selenium peak (Se 3d) that is greater than or equal to about 0.05:1, greater than or equal to about 0.1:1, greater than or equal to about 0.15:1, greater than or equal to about 0.2:1, greater than or equal to about 0.3:1, greater than or equal to about 0.4:1, greater than or equal to about 0.5:1, greater than or equal to about 0.6:1, greater than or equal to about 0.7:1, greater than or equal to about 0.8:1, or greater than or equal to about 0.9:1. In an embodiment, the semiconductor nanoparticle may exhibit, in an XPS analysis thereof, an intensity ratio of a magnesium peak (Mg2p) to a selenium peak (Se 3d) that is less than or equal to about 1.5:1, less than or equal to about 1.3:1, less than or equal to about 1.1:1, less than or equal to about 1:1, less than or equal to about 0.9:1, or less than or equal to about 0.8:1. In the case of the magnesium-oxygen binding, the peak of Mg 2p may appear at or about a binding energy of about 50 eV (for example, 49.5 to 49.8 eV). In the case of the semiconductor nanoparticle, the peak of Mg 2p may appear at a higher energy, for example, a binding energy of greater than or equal to about 50 eV, for example, about 50.6 eV, which indicates Mg—Se binding.

The XPS results for the semiconductor nanoparticle of an embodiment may indicate that the magnesium chalcogenide based semiconductor nanoparticle may be substantially free of a magnesium oxide, a magnesium hydroxide, or a combination thereof or an amount thereof is extremely limited.

In an embodiment, the magnesium chalcogenide or the semiconductor nanoparticle may be crystalline. In an X-ray diffraction analysis, the magnesium chalcogenide may exhibit a pattern of a cubic crystal structure.

In an embodiment, the magnesium chalcogenide may include a zinc magnesium chalcogenide. In an embodiment, the magnesium chalcogenide may include a zinc magnesium selenide, a zinc magnesium telluride, a zinc magnesium sulfide, or a combination thereof.

In an embodiment, the magnesium chalcogenide or the semiconductor nanoparticle may further include an element of the additive (a metal or a non-metal such as an alkali metal, aluminum, boron, optionally an alkaline earth metal (e.g., other than the magnesium), or a combination thereof.

In an embodiment, a mole ratio of the additive element (e.g., the alkali metal, the aluminum, the boron, the alkaline earth metal other than the magnesium, or a combination thereof) to the magnesium in the magnesium chalcogenide or the semiconductor nanoparticle may be greater than or equal to about 0.001:1, greater than or equal to about 0.003:1, greater than or equal to about 0.004:1, greater than or equal to about 0.005:1, greater than or equal to about 0.006:1, greater than or equal to about 0.007:1, greater than or equal to about 0.008:1, greater than or equal to about 0.009:1, greater than or equal to about 0.01:1, greater than or equal to about 0.02:1, greater than or equal to about 0.03:1, greater than or equal to about 0.04:1, greater than or equal to about 0.045:1, greater than or equal to about 0.05:1, greater than or equal to about 0.06:1, greater than or equal to about 0.065:1, greater than or equal to about 0.07:1, greater than or equal to about 0.08:1, greater than or equal to about 0.09:1, greater than or equal to about 0.1:1, greater than or equal to about 0.11:1, greater than or equal to about 0.12:1, greater than or equal to about 0.13:1, greater than or equal to about 0.14:1, greater than or equal to about 0.15:1, greater than or equal to about 0.16:1, greater than or equal to about 0.17:1, greater than or equal to about 0.18:1, greater than or equal to about 0.19:1, greater than or equal to about 0.2:1, greater than or equal to about 0.21:1, greater than or equal to about 0.22:1, greater than or equal to about 0.23:1, greater than or equal to about 0.24:1, greater than or equal to about 0.25:1, greater than or equal to about 0.26:1, greater than or equal to about 0.27:1, greater than or equal to about 0.28:1, greater than or equal to about 0.29:1, greater than or equal to about 0.3:1, greater than or equal to about 0.31:1, greater than or equal to about 0.32:1, greater than or equal to about 0.33:1, greater than or equal to about 0.34:1, greater than or equal to about 0.35:1, greater than or equal to about 0.36:1, greater than or equal to about 0.37:1, greater than or equal to about 0.38:1, greater than or equal to about 0.39:1, or greater than or equal to about 0.4:1.

In an embodiment, a mole ratio of the additive element (e.g., the alkali metal, the aluminum, the boron, the alkaline earth metal other than the magnesium, or a combination thereof) to the magnesium in the magnesium chalcogenide or the semiconductor nanoparticle may be less than or equal to about 1:1, less than or equal to about 0.9:1, less than or equal to about 0.8:1, less than or equal to about 0.7:1, less than or equal to about 0.6:1, less than or equal to about 0.5:1, less than or equal to about 0.4:1, less than or equal to about 0.3:1, less than or equal to about 0.2:1, less than or equal to about 0.1:1, less than or equal to about 0.09:1, less than or equal to about 0.08:1, less than or equal to about 0.07:1, or less than or equal to about 0.068:1.

In the semiconductor nanoparticle of an embodiment, a mole ratio of an alkali metal (e.g., lithium, sodium, potassium, or a combination thereof) or an alkaline earth metal (e.g., barium, calcium, or a combination thereof) to the magnesium may be greater than or equal to about 0.01:1, greater than or equal to about 0.02:1, greater than or equal to about 0.03:1, greater than or equal to about 0.04:1, greater than or equal to about 0.045:1, greater than or equal to about 0.05:1, greater than or equal to about 0.06:1, greater than or equal to about 0.065:1, greater than or equal to about 0.07:1, greater than or equal to about 0.09:1, greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, or greater than or equal to about 0.4:1.

In the semiconductor nanoparticle of an embodiment, a mole ratio of an alkali metal (e.g., lithium, sodium, potassium, or a combination thereof) or an alkaline earth metal (e.g., barium, calcium, or a combination thereof) to the magnesium may be less than or equal to about 1:1, less than or equal to about 0.9:1, less than or equal to about 0.8:1, less than or equal to about 0.7:1, less than or equal to about 0.6:1, less than or equal to about 0.5:1, less than or equal to about 0.4:1, less than or equal to about 0.3:1, less than or equal to about 0.2:1, less than or equal to about 0.1:1, less than or equal to about 0.09:1, less than or equal to about 0.08:1, less than or equal to about 0.07:1, less than or equal to about 0.06:1, or less than or equal to about 0.05:1.

In the semiconductor nanoparticle of an embodiment, a mole ratio of aluminum (or boron) to magnesium may be greater than or equal to about 0.001:1, greater than or equal to about 0.003:1, greater than or equal to about 0.005:1, greater than or equal to about 0.01:1, greater than or equal to about 0.02:1, greater than or equal to about 0.03:1, greater than or equal to about 0.05:1, greater than or equal to about 0.07:1, greater than or equal to about 0.09:1, greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, or greater than or equal to about 0.4; and/or less than or equal to about 1:1, less than or equal to about 0.7:1, less than or equal to about 0.5:1, less than or equal to about 0.3:1, less than or equal to about 0.1:1, or less than or equal to about 0.05:1; or a combination thereof.

The semiconductor nanoparticle may have a core-shell structure. The semiconductor nanoparticle or the core shell structure may include a core including a first semiconductor nanocrystal and a semiconductor nanocrystal shell disposed on the core. The first semiconductor nanocrystal or the core may include a magnesium chalcogenide, a zinc chalcogenide, or a combination thereof. In an embodiment, the first semiconductor nanocrystal or the core may include (a zinc chalcogenide including) zinc, selenium, and tellurium.

A size (or an average size) of the core may be greater than or equal to about 2 nm, greater than or equal to about 3 nm, or greater than or equal to about 4 nm. A size (or an average size) of the core may be less than or equal to about 6 nm, for example, less than or equal to about 5 nm. The first semiconductor nanocrystal may include $ZnTe_xSe_{1-x}$ (wherein, x is greater than 0, greater than or equal to about 0.001, greater than or equal to about 0.003, greater than or equal to about 0.005, greater than or equal to about 0.007, greater than or equal to about 0.009, greater than or equal to about 0.01, greater than or equal to about 0.03, greater than or equal to about 0.05, or greater than or equal to about 0.09 and less than or equal to about 0.1).

Details for the core is the same as set forth herein. The semiconductor nanocrystal shell may include a magnesium chalcogenide, a zinc chalcogenide, or a combination thereof. Details of the magnesium chalcogenide are the same as described herein. The zinc chalcogenide may include a zinc selenide, a zinc telluride, a zinc sulfide, a zinc selenide sulfide, a zinc selenide telluride, a zinc telluride sulfide, or a combination thereof. The zinc chalcogenide may include zinc, selenium, and sulfur. The (semiconductor nanocrystal) shell may be a multi-layered shell including a plurality of layers. In the multi-layered shell, the adjacent layers may include semiconductor materials each having a different composition. The multilayered shell may include a first shell layer disposed (directly) on the core and an outer shell layer (e.g., a second shell layer) disposed on the first shell layer. The semiconductor nanocrystal of the first shell layer may include a magnesium chalcogenide, a zinc magnesium chalcogenide, or a zinc chalcogenide. In an embodiment, the semiconductor nanocrystal of the first shell layer may not include sulfur. The semiconductor nanocrystal of the second shell layer may include zinc and sulfur. In an embodiment, the semiconductor nanocrystal of the second shell layer may include or may not include selenium. The second shell layer may be an outermost shell layer of the semiconductor nanoparticle. The semiconductor nanoparticle may include a semiconductor nanocrystal core and a semiconductor nanocrystal shell disposed on the semiconductor nanocrystal core.

In an embodiment, the semiconductor nanocrystal core may include the magnesium chalcogenide and the dopant, and the semiconductor nanocrystal shell may include a zinc chalcogenide, an indium phosphide, an indium gallium phosphide, or a combination thereof.

In an embodiment, the semiconductor nanocrystal core may include a zinc chalcogenide (e.g., ZnTeSe), an indium phosphide, an indium gallium phosphide, or a combination thereof, and the semiconductor nanocrystal shell may include the magnesium chalcogenide and the dopant.

In an embodiment, the core-multi-layered shell structure may include a ZnSe based core/and multi-layered shell of MgSe/MgSeS/MgS, a ZnSeTe based core and a multi-layered shell of /ZnSe/ZnMgSe/ZnS, or a combination thereof.

In the semiconductor nanocrystal shell or the multi-layered shell, each layer may include a gradient alloy wherein a composition is varied in a radial direction from the core. In an embodiment, an amount or a concentration of the sulfur in the semiconductor nanocrystal shell may vary (increase or decrease) a surface of the semiconductor nanoparticle. In an embodiment, in the shell, an amount of the sulfur in the semiconductor nanocrystal shell may have a concentration gradient increasing away from the core.

In the semiconductor nanoparticle, (for example, as determined by an inductively coupled plasma-atomic emission spectroscopy (ICP-AES)), a mole ratio of tellurium to selenium may be less than or equal to about 0.1:1, less than or equal to about 0.08:1, less than or equal to about 0.07:1, less than or equal to about 0.06:1, less than or equal to about 0.05:1, less than or equal to about 0.045:1, less than or equal to about 0.04:1, less than or equal to about 0.035:1, less than or equal to about 0.03:1, less than or equal to about 0.025:1, less than or equal to about 0.02:1, less than or equal to about 0.015:1, less than or equal to about 0.01:1, less than or equal to about 0.009:1, less than or equal to about 0.008:1, less than or equal to about 0.007:1, less than or equal to about 0.006:1, or less than or equal to about 0.005:1.

The mole ratio of tellurium to selenium may be greater than or equal to about 0.0001:1, greater than or equal to about 0.00015:1, greater than or equal to about 0.0002:1, greater than or equal to about 0.00025:1, greater than or equal to about 0.0003:1, greater than or equal to about 0.00035:1, greater than or equal to about 0.0004:1, greater than or equal to about 0.00045:1, greater than or equal to about 0.0005:1, greater than or equal to about 0.00055:1, greater than or equal to about 0.006:1, greater than or equal to about 0.00065:1, greater than or equal to about 0.0007:1, greater than or equal to about 0.00075:1, greater than or equal to about 0.0008:1, greater than or equal to about 0.00085:1, greater than or equal to about 0.0009:1, greater than or equal to about 0.00095:1, greater than or equal to about 0.001:1, greater than or equal to about 0.0015:1, greater than or equal to about 0.002:1, greater than or equal to about 0.0025:1, greater than or equal to about 0.003:1, greater than or equal to about 0.0035:1, greater than or equal to about 0.004:1, or greater than or equal to about 0.0045:1. The mole ratio of tellurium to selenium may be from about 0.004:1 to about 0.01:1. The mole ratio of tellurium to selenium may be from about 0.0002:1 to about 0.02:1. The mole ratio of tellurium to selenium may be from about 0.0003:1 to about 0.03:1.

In the semiconductor nanoparticle, a mole ratio of tellurium to zinc (for example, as determined by an ICP-AES)

may be less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, less than or equal to about 0.01:1, less than or equal to about 0.009:1, less than or equal to about 0.008:1, less than or equal to about 0.007:1, less than or equal to about 0.006:1, or less than or equal to about 0.005:1. The mole ratio of tellurium to zinc may be greater than or equal to about 0.0001:1, greater than or equal to about 0.0002:1, greater than or equal to about 0.0003:1, greater than or equal to about 0.0004:1, greater than or equal to about 0.0005:1, greater than or equal to about 0.0006:1, greater than or equal to about 0.0007:1, greater than or equal to about 0.0008:1, greater than or equal to about 0.0009:1, greater than or equal to about 0.001:1, greater than or equal to about 0.0011:1, greater than or equal to about 0.0012:1, greater than or equal to about 0.0013:1, greater than or equal to about 0.0014:1, greater than or equal to about 0.0015:1, greater than or equal to about 0.0018:1, greater than or equal to about 0.0019:1, or greater than or equal to about 0.002:1.

In the semiconductor nanoparticle, as determined by ICP-AES analysis, a mole ratio of Se to Zn may be less than or equal to about 2:1, less than or equal to about 1.5:1, less than or equal to about 1:1, less than or equal to about 0.99:1, 0.95:1, less than or equal to about 0.90:1, less than or equal to about 0.85:1, less than or equal to about 0.8:1, less than or equal to about 0.75:1, less than or equal to about 0.7:1, less than or equal to about 0.65:1, less than or equal to about 0.6:1, less than or equal to about 0.55:1, less than or equal to about 0.5:1, less than or equal to about 0.45:1, or less than or equal to about 0.4:1.

In the semiconductor nanoparticle, as determined by ICP-AES analysis, a mole ratio of Se to Zn may be greater than or equal to about 0.1:1, greater than or equal to about 0.2:1, greater than or equal to about 0.3:1, greater than or equal to about 0.4:1, greater than or equal to about 0.45:1, greater than or equal to about 0.46:1, greater than or equal to about 0.48:1, greater than or equal to about 0.5:1, greater than or equal to about 0.52:1, greater than or equal to about 0.53:1, greater than or equal to about 0.54:1, greater than or equal to about 0.55:1, greater than or equal to about 0.56:1, greater than or equal to about 0.57:1, greater than or equal to about 0.58:1, greater than or equal to about 0.59:1, greater than or equal to about 0.6:1, greater than or equal to about 0.65:1, greater than or equal to about 0.7:1, greater than or equal to about 0.75:1, greater than or equal to about 0.8:1, greater than or equal to about 0.85:1, greater than or equal to about 0.9:1, or greater than or equal to about 0.95:1.

In the semiconductor nanoparticle, a mole ratio of sulfur to selenium (S:Se) may be less than or equal to about 2.4:1, less than or equal to about 2:1, less than or equal to about 1.95:1, less than or equal to about 1.9:1, less than or equal to about 1.85:1, less than or equal to about 1.80:1, less than or equal to about 1.40:1, less than or equal to about 1.25:1, less than or equal to about 1.19:1, less than or equal to about 0.95:1, less than or equal to about 0.8:1, less than or equal to about 0.75:1, less than or equal to about 0.7:1, less than or equal to about 0.65:1, less than or equal to about 0.6:1, less than or equal to about 0.55:1, less than or equal to about 0.5:1, less than or equal to about 0.45:1, less than or equal to about 0.4:1, less than or equal to about 0.35:1, less than or equal to about 0.3:1, less than or equal to about 0.25:1, less than or equal to about 0.2:1, or less than or equal to about 0.199:1. In the semiconductor nanoparticle, a mole ratio of sulfur to selenium (S:Se) may be greater than or equal to about 0.05:1, greater than or equal to about 0.1:1, greater than or equal to about 0.11:1, greater than or equal to about 0.12:1, greater than or equal to about 0.13:1, greater than or equal to about 0.135:1, greater than or equal to about 0.14:1, greater than or equal to about 0.145:1, greater than or equal to about 0.15:1, greater than or equal to about 0.16:1, greater than or equal to about 0.17:1, greater than or equal to about 0.18:1, greater than or equal to about 0.19:1, greater than or equal to about 0.195:1, greater than or equal to about 0.2:1, greater than or equal to about 0.3:1, greater than or equal to about 0.4:1, greater than or equal to about 0.5:1, greater than or equal to about 0.6:1, greater than or equal to about 0.7:1, greater than or equal to about 0.95:1, greater than or equal to about 1:1, greater than or equal to about 1.1:1, greater than or equal to about 1.23:1, greater than or equal to about 1.25:1, greater than or equal to about 1.3:1, greater than or equal to about 1.4:1, or greater than or equal to about 1.95:1.

In the semiconductor nanoparticle, a mole ratio of a sum of selenium and sulfur to zinc ((S+Se):Zn) may be greater than or equal to about 0.88:1, greater than or equal to about 0.89:1, greater than or equal to about 0.90:1, greater than or equal to about 0.91:1, greater than or equal to about 0.92:1, greater than or equal to about 0.93:1, greater than or equal to about 0.94:1, greater than or equal to about 0.95:1, greater than or equal to about 0.96:1, greater than or equal to about 0.97:1, greater than or equal to about 0.98:1, greater than or equal to about 0.99:1, or greater than or equal to about 1:1. In the semiconductor nanoparticle, a mole ratio of a sum of selenium and sulfur to zinc ((S+Se):Zn) may be less than or equal to about 3:1, less than or equal to about 2.5:1, less than or equal to about 2:1, less than or equal to about 1.5:1, less than or equal to about 1.4:1, less than or equal to about 1.3:1, less than or equal to about 1.2:1, less than or equal to about 1.1:1, less than or equal to about 1:1, less than or equal to about 0.99:1, less than or equal to about 0.98:1, less than or equal to about 0.97:1, less than or equal to about 0.96:1, less than or equal to about 0.95:1, or less than or equal to about 0.94:1.

In the semiconductor nanoparticle, a mole ratio of magnesium to tellurium (Mg:Te) may be greater than or equal to about 0.1:1, greater than or equal to about 0.5:1, greater than or equal to about 1:1, greater than or equal to about 5:1, greater than or equal to about 10:1, greater than or equal to about 15:1, greater than or equal to about 20:1, greater than or equal to about 25:1, greater than or equal to about 30:1, greater than or equal to about 35:1, or greater than or equal to about 40:1. In the semiconductor nanoparticle, a mole ratio of magnesium to tellurium (Mg:Te) may be less than or equal to about 500:1, less than or equal to about 300:1, less than or equal to about 250:1, less than or equal to about 240:1, less than or equal to about 230:1, less than or equal to about 220:1, less than or equal to about 200:1, less than or equal to about 150:1, less than or equal to about 100:1, less than or equal to about 90:1, less than or equal to about 80:1, less than or equal to about 70:1, less than or equal to about 60:1, less than or equal to about 55:1, or less than or equal to about 50:1.

In the semiconductor nanoparticle, a mole ratio of an additive element (for example, the alkali metal, the alkaline earth metal except for, e.g., other than, the magnesium, the aluminum, the boron, or a combination thereof) to tellurium may be greater than or equal to about 0.1:1, greater than or equal to about 0.3:1, greater than or equal to about 0.5:1, greater than or equal to about 0.7:1, greater than or equal to about 0.9:1, greater than or equal to about 1:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, greater than or equal to about 2.2:1, greater than or equal to about 2.3:1, greater than or equal to about 2.4:1, greater than or equal to about 2.5:1, greater than or equal to about 2.6:1, greater than or equal to about 2.7:1, greater than or equal to about 2.8:1, greater than or equal to about 2.9:1, greater than or equal to about 3:1, greater than or equal to about 4:1, greater than or equal to about 5:1, greater than or equal to about 6:1, greater than or equal to about 7:1, greater than or equal to about 8:1, greater than or equal to about 9:1, or greater than or equal to about 10:1.

In the semiconductor nanoparticle, a mole ratio of an additive element (for example, the alkali metal, the alkaline earth metal except for, e.g., other than, the magnesium, the aluminum, the boron, or a combination thereof) to tellurium may be less than or equal to about 100:1, less than or equal to about 50:1, less than or equal to about 40:1, less than or equal to about 30:1, less than or equal to about 20:1, less than or equal to about 15:1, less than or equal to about 10:1, less than or equal to about 9:1, less than or equal to about 8:1, less than or equal to about 7:1, less than or equal to about 6:1, less than or equal to about 5:1, less than or equal to about 4:1, less than or equal to about 3:1, less than or equal to about 2:1, or less than or equal to about 1:1.

In the semiconductor nanoparticle, a mole ratio of magnesium to zinc may be greater than or equal to about 0.001:1, greater than or equal to about 0.005:1, greater than or equal to about 0.01:1, greater than or equal to about 0.02:1, greater than or equal to about 0.03:1, greater than or equal to about 0.04:1, greater than or equal to about 0.05:1, greater than or equal to about 0.06:1, greater than or equal to about 0.07:1, greater than or equal to about 0.08:1, greater than or equal to about 0.09:1, greater than or equal to about 0.1:1, greater than or equal to about 0.11:1, greater than or equal to about 0.12:1, greater than or equal to about 0.13:1, greater than or equal to about 0.14:1, greater than or equal to about 0.15:1, greater than or equal to about 0.16:1, greater than or equal to about 0.17:1, greater than or equal to about 0.18:1, greater than or equal to about 0.19:1, greater than or equal to about 0.2:1, greater than or equal to about 0.21:1, greater than or equal to about 0.22:1, greater than or equal to about 0.23:1, greater than or equal to about 0.24:1, greater than or equal to about 0.25:1, greater than or equal to about 0.26:1, greater than or equal to about 0.27:1, greater than or equal to about 0.28:1, greater than or equal to about 0.29:1, greater than or equal to about 0.3:1, greater than or equal to about 0.31:1, greater than or equal to about 0.32:1, greater than or equal to about 0.33:1, greater than or equal to about 0.34:1, greater than or equal to about 0.35:1, greater than or equal to about 0.36:1, greater than or equal to about 0.37:1, greater than or equal to about 0.38:1, greater than or equal to about 0.39:1, or greater than or equal to about 0.4:1.

In the semiconductor nanoparticle, a mole ratio of magnesium to zinc may be less than or equal to about 10:1, less than or equal to about 9:1, less than or equal to about 8:1, less than or equal to about 7:1, less than or equal to about 6:1, less than or equal to about 5:1, less than or equal to about 4:1, less than or equal to about 3:1, less than or equal to about 2:1, less than or equal to about 1.5:1, less than or equal to about 1:1, less than or equal to about 0.9:1, less than or equal to about 0.85:1, less than or equal to about 0.8:1, less than or equal to about 0.75:1, less than or equal to about 0.7:1, less than or equal to about 0.65:1, less than or equal to about 0.6:1, less than or equal to about 0.55:1, less than or equal to about 0.5:1, less than or equal to about 0.45:1, less than or equal to about 0.4:1, less than or equal to about 0.39:1, less than or equal to about 0.38:1, less than or equal to about 0.37:1, less than or equal to about 0.36:1, less than or equal to about 0.35:1, less than or equal to about 0.34:1, less than or equal to about 0.33:1, less than or equal to about 0.32:1, less than or equal to about 0.31:1, less than or equal to about 0.3:1, less than or equal to about 0.29:1, less than or equal to about 0.28:1, less than or equal to about 0.27:1, less than or equal to about 0.26:1, less than or equal to about 0.25:1, less than or equal to about 0.24:1, less than or equal to about 0.23:1, less than or equal to about 0.22:1, less than or equal to about 0.21:1, less than or equal to about 0.2:1, less than or equal to about 0.19:1, less than or equal to about 0.18:1, less than or equal to about 0.17:1, less than or equal to about 0.16:1, less than or equal to about 0.15:1, less than or equal to about 0.14:1, less than or equal to about 0.13:1, less than or equal to about 0.12:1, less than or equal to about 0.11:1, less than or equal to about 0.1:1, or less than or equal to about 0.09:1.

In an embodiment, the semiconductor nanoparticle may have a size or an average size of greater than or equal to about 3 nm, greater than or equal to about 4 nm, or greater than or equal to about 5 nm and less than or equal to about 50 nm. The semiconductor nanoparticle may have a size or an average size (e.g., the diameters of the particles or equivalent diameters that can be determined with an electron microscope) of greater than or equal to about 3 nm, greater than or equal to about 4 nm, greater than or equal to about 5 nm, greater than or equal to about 5.5 nm, greater than or equal to about 6 nm, greater than or equal to about 6.5 nm, greater than or equal to about 7 nm, greater than or equal to about 7.5 nm, greater than or equal to about 8 nm, greater than or equal to about 8.5 nm, greater than or equal to about 9 nm, greater than or equal to about 9.5 nm, greater than or equal to about 10 nm, greater than or equal to about 10.5 nm, greater than or equal to about 11 nm, greater than or equal to about 11.5 nm, or greater than or equal to about 12 nm. The size (or the average size) of the nanoparticle may be less than or equal to about 50 nm, less than or equal to about 40 nm, less than or equal to about 35 nm, less than or equal to about 29 nm, less than or equal to about 28 nm, less than or equal to about 27 nm, less than or equal to about 26 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, or less than or equal to about 12 nm. In an embodiment, the (average) size of the nanoparticle(s) may be from about 4.7 to about 15 nm, about 5.6 to about 12 nm, about 6.9 to about 11 nm, about 7.4 to about 10 nm, about 8 to about 9 nm, or a combination thereof. As used herein, the average may be a mean average. As used herein, the average may be a median. As used herein, the numerical value may be a lower or upper limit of a range.

In an embodiment, the semiconductor nanoparticles may show improved particle size distribution. In an embodiment, the semiconductor nanoparticles may exhibit a standard deviation of the particle sizes that is less than or equal to about 15%, less than or equal to about 12.5%, less than or equal to about 11%, less than or equal to about 10%, less than or equal to about 9%, less than or equal to about 8.5%, less than or equal to about 8%, less than or equal to about 7.5%, or less than or equal to about 7%, based on an average size thereof.

In an embodiment, the particle size and the particle shape factor described herein may be readily and reproducibility analyzed and obtained by using an image (a two-dimensional image) obtained from an electron microscopic analysis (e.g., a transmission electron microscopy analysis or a scanning electron microscopy analysis) and using any appropriate (e.g., known or commercially available) image analysis program such as "image J," for example, according to a manual provided with a manufacturer (e.g., Image J User Guide IJ 1.46r). The image analysis tool and measurement conditions (e.g., a smoothing number) are not particularly limited.

By the inclusion of the magnesium chalcogenide based shell layer, the semiconductor nanoparticle of an embodiment, may exhibit an improved shape factor. Without wishing to be bound by any theory, it is believed that the shell layer of the magnesium chalcogenide may be applied as an inter-layer, whereby the resulting nanoparticles may have a more uniform coating thereon.

Accordingly, in an embodiment, the semiconductor nanoparticle may have a solidity or an average value of the solidity that is greater than or equal to about 0.9, greater than or equal to about 0.91, greater than or equal to about 0.92, greater than or equal to about 0.93, greater than or equal to about 0.94, greater than or equal to about 0.95, greater than or equal to about 0.96, or greater than or equal to about 0.97 and less than or equal to about 1, less than or equal to about 0.995, less than or equal to about 0.99, less than or equal to about 0.985, or less than or equal to about 0.98.

The solidity, S is defined by the following equation, as the image area A, divided by the convex hull area, Ac.

$$S = \frac{A}{A_C}$$

wherein

A: an area of a two dimensional image of an individual semiconductor nanoparticle; and Ac: an area of a convex hull of the two dimensional image of the individual semiconductor nanoparticle.

In an embodiment, the semiconductor nanoparticles may have an average circularity of greater than or equal to about 0.75, greater than or equal to about 0.76, greater than or equal to about 0.765, greater than or equal to about 0.77, greater than or equal to about 0.775, greater than or equal to about 0.78, greater than or equal to about 0.79, greater than or equal to about 0.8, greater than or equal to about 0.81, greater than or equal to about 0.82, greater than or equal to about 0.83, greater than or equal to about 0.84, or greater than or equal to about 0.85.

In an embodiment, the circularity is a shape factor about how a cross-section of a given particle is close to a circle taking into consideration a smoothness of a perimeter. The circularity may be determined by the following definition in a two dimensional image obtained by an electron microscopy analysis:

$$circularity = 4\pi \times \frac{Area}{[Perimeter]^2}$$

wherein "Area" is an area of a two dimensional image(s) of individual semiconductor nanoparticle(s), and "Perimeter" is a circumference of a two dimensional image(s) of individual semiconductor nanoparticle(s).

The circularity may be a flat projection of sphericity and may be a shape factor representing the sphericity. In an embodiment, the semiconductor nanoparticles may have a relatively higher, e.g., larger, sphericity than a cadmium free semiconductor nanoparticle including a zinc-tellurium-selenium compound. In an embodiment, the circularity of the semiconductor nanoparticles may represent a different aspect from a solidity or a roundness.

In an embodiment, the nanoparticle (or the core, the shell, or a combination thereof) may not include a Group III-V compound including indium, gallium, or a combination thereof, manganese, copper, or a combination thereof. The Group III-V compound may include indium phosphide, indium zinc phosphide, indium gallium phosphide, gallium phosphide, or a combination thereof.

In an embodiment, the semiconductor nanoparticle may be configured to emit light having a visible wavelength range (e.g., blue light, green light, or red light).

In an embodiment, the semiconductor nanoparticles may emit blue light with light excitation or application of a voltage, and a maximum luminescent peak wavelength of the light may be greater than or equal to about 430 nm (for example, greater than or equal to about 435 nm, greater than or equal to about 440 nm, greater than or equal to about 446 nm, greater than or equal to about 449 nm, or greater than or equal to about 450 nm) and less than or equal to about 480 nm (for example, less than or equal to about 470 nm, less than or equal to about 465 nm, less than or equal to about 460 nm, or less than or equal to about 455 nm).

In an embodiment, the semiconductor nanoparticles may emit green light with light excitation or application of a voltage, and a maximum luminescent peak wavelength of the light may be greater than or equal to about 500 nm (for example, greater than or equal to about 510 nm or greater than or equal to about 515 nm) and less than or equal to about 560 nm (for example, less than or equal to about 540 nm or less than or equal to about 535 nm). In an embodiment, the semiconductor nanoparticle may emit red light with light excitation or application of a voltage, and a maximum luminescent peak wavelength of the light may be greater than or equal to about 600 nm (for example, greater than or equal to about 610 nm) and less than or equal to about 650 nm (for example, less than or equal to about 640 nm).

In an embodiment, the semiconductor nanoparticle may have a quantum yield or quantum efficiency of greater than or equal to about 1%, greater than or equal to about 5%, greater than or equal to about 10%, greater than or equal to about 15%, greater than or equal to about 20%, greater than or equal to about 25%, greater than or equal to about 30%, greater than or equal to about 35%, greater than or equal to about 45%, greater than or equal to about 50%, greater than or equal to about 55%, greater than or equal to about 60%, greater than or equal to about 65%, greater than or equal to about 70%, greater than or equal to about 75%, greater than or equal to about 80%, greater than or equal to about 85%, or greater than or equal to about 88%. The quantum yield or the quantum efficiency (hereinafter, "quantum yield") may be an absolute quantum yield. The quantum yield may be about 1 to about 100%, about 5 to about 95%, about 10 to about 90%, about 15 to about 85%, about 20 to about 80%, or a combination thereof.

In an embodiment, the semiconductor nanoparticle may exhibit a full width at half maximum of about 10 to about 40 nm, about 15 to about 35 nm, about 20 to about 30 nm, about 25 to about 28 nm, or a combination thereof.

In an embodiment, the semiconductor nanoparticles including the shell of the magnesium chalcogenide may exhibit a luminescent peak wavelength that is shifted toward the blue light wavelength region (or shorter wavelength) in comparison with the luminescent peak wavelength of the core.

The core including a zinc chalcogenide containing tellurium may emit blue light of a desired wavelength. As the amount of the tellurium is increased to emit a blue light of a desired wavelength, a final core shell semiconductor nanoparticle may tend to show, e.g., may exhibit, a relatively widened full width at half maximum. In an embodiment, a semiconductor nanocrystal shell including a magnesium chalcogenide may be disposed to form a semiconductor nanoparticle, whereby the nanoparticle may emit blue light of a desired wavelength together with a relatively narrow full width at half maximum that is less than or equal to about 32 nm, less than or equal to about 30 nm, less than or equal to about 29 nm, less than or equal to about 28 nm, less than or equal to about 27 nm, or less than or equal to about 26 nm.

In a UV-Vis absorption spectrum, the semiconductor nanoparticle of an embodiment may exhibit a valley depth of greater than or equal to about 0.1, greater than or equal to about 0.2, greater than or equal to about 0.3, greater than or equal to about 0.4, or greater than or equal to about 0.5, as defined by following equation:

$$1-(\text{Abs}_{valley}/\text{Abs}_{first})=VD$$

wherein $\text{Abs}_{first}$ is the absorbance at a first absorption peak and $\text{Abs}_{valley}$ is the absorbance at a valley adjacent to the first absorption peak.

According to an embodiment is provided an electroluminescent device including the semiconductor nanoparticles of an embodiment. In an embodiment, the electroluminescent device includes a first electrode 1 and a second electrode 5 spaced apart from each other (e.g., each having a surface opposite the other, i.e., each with a surface facing each other); and a light emitting layer 3 disposed between the first electrode 1 and the second electrode 5. (See FIG. 1) The light emitting layer may not contain cadmium. The first electrode may include an anode, and the second electrode may include a cathode. Alternatively, the first electrode may include a cathode and the second electrode may include an anode. In an embodiment, the electroluminescent device may further include a hole auxiliary layer 2 between the light emitting layer and the first electrode. In an embodiment, the electroluminescent device may further include an electron auxiliary layer 4 between the light emitting layer and the second electrode.

In the electroluminescent device of an embodiment, the first electrode 10 or the second electrode 20 may be disposed on a (transparent) substrate 100. The transparent substrate may be a light extraction surface. (See FIGS. 2 and 3).

Figure 2:
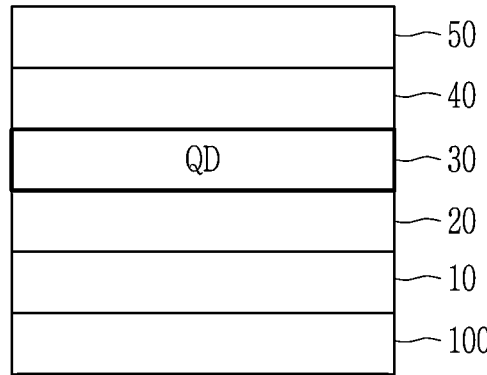
FIG. 2 is a schematic cross-sectional view of a light-emitting device including a semiconductor nanoparticle according to an embodiment.
Figure 3:
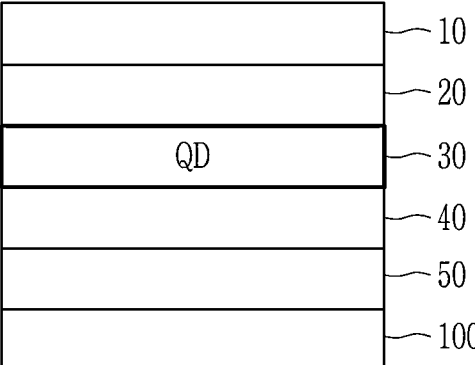
FIG. 3 is a schematic cross-sectional view of a light-emitting device including a semiconductor nanoparticle according to an embodiment.

Referring to FIG. 2 and FIG. 3, in a light emitting device of an embodiment, a light emitting layer 30 may be disposed between a first electrode (e.g., anode) 10 and a second electrode (e.g., cathode) 20. The cathode 50 may include an electron injection conductor. The anode 10 may include a hole injection conductor. The work functions of the electron/hole injection conductors included in the cathode and the anode may be appropriately adjusted and are not particularly limited. For example, the cathode may have a small work function and the anode may have a relatively large work function, or vice versa.

The electron/hole injection conductors may include a metal-based material (e.g., a metal, a metal compound, an alloy, or a combination thereof) (e.g., aluminum, magnesium, tungsten, nickel, cobalt, platinum, palladium, calcium, LiF, etc.), a metal oxide such as gallium indium oxide or indium tin oxide (ITO), or a conductive polymer (e.g., having a relatively high work function) such as polyethylene dioxythiophene, but are not limited thereto.

The first electrode, the second electrode, or a combination thereof may be a light-transmitting electrode or a transparent electrode. In an embodiment, both the first electrode and the second electrode may be a light-transmitting electrode. The electrode may be patterned. The first electrode, the second electrode, or a combination thereof may be disposed on a (e.g., insulating) substrate. The substrate may be optically transparent (e.g., may have a light transmittance of greater than or equal to about 50%, greater than or equal to about 60%, greater than or equal to about 70%, greater than or equal to about 80%, greater than or equal to about 85%, or greater than or equal to about 90% and for example, less than or equal to about 99%, or less than or equal to about 95%). The substrate may include a region for a blue pixel, a region for a red pixel, a region for a green pixel, or a combination thereof. A thin film transistor may be disposed in each region of the substrate, and one of a source electrode and a drain electrode of the thin film transistor may be electrically connected to the first electrode or the second electrode.

The light-transmitting electrode may be disposed on a (e.g., insulating) transparent substrate. The substrate may be a rigid or a flexible substrate. The substrate may include a plastic or organic material such as a polymer, an inorganic material such as a glass, or a metal.

The light-transmitting electrode may be made of, for example, a transparent conductor such as indium tin oxide (ITO) or indium zinc oxide (IZO), gallium indium tin oxide, zinc indium tin oxide, titanium nitride, polyaniline, LiF/Mg:Ag, or the like, or a thin metal thin film of a single layer or a plurality of layers, but is not limited thereto. If one of the first electrode and the second electrode is an opaque electrode, the opaque electrode may be made of an opaque conductor such as aluminum (Al), a lithium-aluminum (Li:Al) alloy, a magnesium-silver (Mg:Ag) alloy, or a lithium fluoride-aluminum (LiF:Al) compound.

The thickness of each of the electrodes (the first electrode, the second electrode, or each of the first electrode and the second electrode) is not particularly limited and may be appropriately selected in consideration of device efficiency. For example, the thickness of the electrode may be greater than or equal to about 5 nm, for example, greater than or equal to about 10 nm, greater than or equal to about 20 nm, greater than or equal to about 30 nm, greater than or equal to about 40 nm, or greater than or equal to about 50 nm. For example, the thickness of the electrode may be less than or equal to about 100 micrometers (μm), for example, less than or equal to about 90 μm, less than or equal to about 80 μm, less than or equal to about 70 μm, less than or equal to about 60 μm, less than or equal to about 50 μm, less than or equal to about 40 μm, less than or equal to about 30 μm, less than or equal to about 20 μm, less than or equal to about 10 μm, less than or equal to about 1 μm, less than or equal to about 900 nm, less than or equal to about 500 nm, or less than or equal to about 100 nm.

The light emitting layer 30 disposed between the first electrode and the second electrode (e.g., the anode 10 and the cathode 50) may include semiconductor nanoparticles (e.g., blue light emitting nanoparticles, red light emitting nanoparticles, and/or green light emitting nanoparticles, or a combination thereof). The semiconductor nanoparticles may not comprise cadmium. The light emitting layer may include one or more (e.g., 2 or more or 3 or more and 10 or less) monolayers of a plurality of nanostructures. The semiconductor nanoparticles may include the semiconductor nanoparticles described herein. Details of the semiconductor nanoparticles are the same as described herein.

The light emitting layer may be patterned. In an embodiment, the patterned light emitting layer may include a blue light emitting layer disposed in the blue pixel. In an embodiment, the light emitting layer may further include a red light emitting layer disposed in the red pixel, a green light emitting layer disposed in the green pixel, or a red light emitting layer disposed in the red pixel and a green light emitting layer disposed in the green pixel. Each of the (e.g., red, green, or blue) light emitting layers may be (e.g., optically) separated from an adjacent light emitting layer by a partition wall. In an embodiment, partition walls such as black matrices may be disposed between the red light emitting layer, the green light emitting layer, and the blue light emitting layer. The red light emitting layer, the green light emitting layer, and the blue light emitting layer may be optically isolated from each other.

In an embodiment, the light emitting layer or the semiconductor nanoparticles may not include cadmium. In an embodiment, the light emitting layer or the semiconductor nanoparticles may not include lead, or a combination thereof. Details of the semiconductor nanoparticles are the same as set forth herein.

In an electroluminescent device of an embodiment, a thickness of the light emitting layer may be selected appropriately.

In an embodiment, the light emitting layer 3 or 30 may include a monolayer of semiconductor nanoparticles. In an embodiment, the light emitting layer 3 or 30 may include a monolayer of semiconductor nanoparticles, e.g., one or more, two or more, three or more, or four or more and 20 or less, 10 or less, 9 or less, 8 or less, 7 or less, or 6 or less, monolayers of semiconductor nanoparticles. The light emitting layer 30 may have a thickness of greater than or equal to about 5 nm, for example, greater than or equal to about 10 nm, greater than or equal to about 20 nm, or greater than or equal to about 30 nm and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The light emitting layer 30 may have a thickness of, for example about 10 nm to about 150 nm, for example, about 20 nm to about 100 nm, or for example about 30 nm to about 50 nm.

The forming of the light emitting layer may be performed by preparing a composition including nanostructures (configured to emit desired light) and applying or depositing the composition on a substrate for example including an electrode or a charge auxiliary layer in an appropriate method (e.g., spin coating, inkjet printing, and the like).

The electroluminescent device may further include a charge (hole or electron) auxiliary layer between the first electrode and the second electrode (e.g., an anode and a cathode). In an embodiment, the electroluminescent device may include a hole auxiliary layer 20 or an electron auxiliary layer 40 between the anode 10 and the light emitting layer 30, between the cathode 50 and the light emitting layer 30, or a combination thereof. See, FIGS. 2 and 3.

The light emitting device according to an embodiment may further include a hole auxiliary layer. The hole auxiliary layer 20 may be disposed between the first electrode 10 and the light emitting layer 30. The hole auxiliary layer 20 may include a hole injection layer, a hole transport layer, an electron blocking layer, or a combination hereof. The hole auxiliary layer 20 may be a layer of a single component or a multilayer structure in which adjacent layers include different components.

The HOMO energy level of the hole auxiliary layer 20 may have a HOMO energy level that can be matched with the HOMO energy level of the light emitting layer 30 in order to enhance mobility of holes transferred from the hole auxiliary layer 20 to the light emitting layer 30. In an embodiment, the hole auxiliary layer 20 may include a hole injection layer close to the first electrode 10 and a hole transport layer close to the light emitting layer 30.

The material included in the hole auxiliary layer 20 (e.g., a hole transport layer, a hole injection layer, or an electron blocking layer) is not particularly limited, and may include, for example, poly(9,9-dioctyl-fluorene-co-N-(4)-butylphenyl)-diphenylamine) (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis (4-methoxyphenyl)-benzidine (TPD), 4,4'-bis[N-(1-naphthyl)-N-phenyl-amino]biphenyl ($\alpha$-NPD), m-MTDATA (4,4',4"-Tris[phenyl(m-tolyl)amino]triphenylamine), 4,4', 4"-tris(N-carbazolyl)-triphenylamine (TCTA), 1,1-bis[(di-4-toylamino)phenylcyclohexane (TAPC), a p-type metal oxide (e.g., NiO, WO$_3$, MoO$_3$, etc.), a carbon-based material such as graphene oxide, or a combination thereof, but is not limited thereto.

In the hole auxiliary layer, the thickness of each layer may be appropriately selected. For example, the thickness of each layer may be greater than or equal to about 5 nm, greater than or equal to about 10 nm, greater than or equal to about 15 nm, or greater than or equal to about 20 nm and less than or equal to about 100 nm, less than or equal to about 90 nm, less than or equal to about 80 nm, less than or equal to about 70 nm, less than or equal to about 60 nm, less than or equal to about 50 nm, less than or equal to about for example, 40 nm, less than or equal to about 35 nm, or less than or equal to about 30 nm, but is not limited thereto.

The electron auxiliary layer 40 is disposed between the light emitting layer 30 and the second electrode 50. The electron auxiliary layer 40 may include, for example, an electron injection layer, an electron transport layer, a hole blocking layer, or a combination thereof. The electron auxiliary layer may include, for example, an electron injection layer (EIL) that facilitates injection of electrons, an electron transport layer (ETL) that facilitates transport of electrons, a hole blocking layer (HBL) that blocks the movement of holes, or a combination thereof.

In an embodiment, the electron injection layer may be disposed between the electron transport layer and the cathode. For example, the hole blocking layer may be disposed between the light emitting layer and the electron transport (injection) layer but is not limited thereto. The thickness of each layer may be selected appropriately. For example, the thickness of each layer may be greater than or equal to about 1 nm and less than or equal to about 500 nm, but is not limited thereto. The electron injection layer may be an organic layer formed by vapor deposition. The electron transport layer may include inorganic oxide nanoparticles or may be an organic layer formed by vapor deposition.

The electron transport layer (ETL), the electron injection layer, the hole blocking layer, or a combination thereof may include, for example, 1,4,5,8-naphthalene-tetracarboxylic dianhydride (NTCDA), bathocuproine (BCP), tris[3-(3-pyridyl)-mesityl]borane (3TPYMB), LiF tris(8-hydroxyquinoline)aluminum (Alq$_3$), tris(8-hydroxyquinoline)gallium (Gaq$_3$), tris(8-hydroxyquinoline)indium (Inq$_3$), bis(8-hydroxyquinoline)zinc (Znq$_2$), bis(2-2-hydroxyphenyl)benzo-thiazolate)zinc (Zn(BTZ)$_2$), bis(10-hydroxybenzo[h]quinolinato)beryllium (BeBq$_2$), 8-(4-(4,6-di(naphthalen-2-yl)-1,3,5-triazin-2-yl)phenyl)quinolone (ET204), 8-hydroxyquinolinato lithium (Liq), an n-type metal oxide (e.g., ZnO, HfO$_2$, etc.) or a combination thereof, but is not limited thereto.

The electron auxiliary layer 40 may include an electron transport layer. The electron transport layer may include a plurality of nanoparticles. The plurality of nanoparticles may include a metal oxide containing zinc.

The metal oxide may include zinc oxide, zinc magnesium oxide, or a combination thereof. The metal oxide may include Zn$_{1-x}$M$_x$O, wherein M is Mg, Ca, Zr, W, Li, Ti, Y, Al, or a combination thereof and 0≤x≤0.5. In an embodiment, M in the formula may be magnesium (Mg). In an embodiment, in the formula, x may be greater than or equal to about 0.01 and less than or equal to about 0.3, for example, less than or equal to about 0.25, less than or equal to about 0.2, or less than or equal to about 0.15.

The absolute value of the LUMO of the aforementioned nanostructures included in the light emitting layer may be greater or smaller than the absolute value of the LUMO of the metal oxide. The average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm.

In an embodiment, each thickness of the electron auxiliary layer 40 (e.g., electron injection layer, electron transport layer, or hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm, and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

A device according to an embodiment may have a normal structure. In an embodiment, in the device, the anode 10 disposed on the transparent substrate 100 may include a metal oxide-based transparent electrode (e.g., an ITO electrode), and the cathode 50 facing the anode 10 may include a conductive metal (e.g., having a relatively low work function, Mg, Al, etc.). The hole auxiliary layer 20 (e.g., a hole injection layer such as PEDOT:PSS, p-type metal oxide, or a combination thereof; a hole transport layer such as TFB, PVK, or a combination thereof; or a combination thereof) may be provided between the transparent electrode 10 and the light emitting layer 30. The hole injection layer may be disposed close to the transparent electrode and the hole transport layer may be disposed close to the light emitting layer. The electron auxiliary layer 40 such as an electron injection/transport layer may be disposed between the light emitting layer 30 and the cathode 50. (Refer to FIG. 2)

A device according to an embodiment may have an inverted structure. Herein, the cathode 50 disposed on the transparent substrate 100 may include a metal oxide-based transparent electrode (e.g., ITO), and the anode 10 facing the cathode may include a metal (e.g., having a relatively high work function, Au, Ag, etc.). For example, an (optionally doped) n-type metal oxide (crystalline Zn metal oxide) or the like may be disposed as an electron auxiliary layer 40 (e.g., an electron transport layer) between the transparent electrode 50 and the light emitting layer 30. MoO$_3$ or other p-type metal oxide may be disposed as a hole auxiliary layer 20 (e.g., a hole transport layer including TFB, PVK, or a combination thereof; a hole injection layer including MoO$_3$ or other p-type metal oxide; or a combination thereof) between the metal anode 10 and the light emitting layer 30. See, FIG. 3.

The aforementioned device may be manufactured by an appropriate method. For example, the electroluminescent device may be manufactured by optionally forming a hole auxiliary layer (e.g., by deposition or coating) on a substrate on which an electrode is disposed, forming a light emitting layer including nanostructures (e.g., a pattern of the aforementioned nanostructures), and forming (optionally, an electron auxiliary layer and) an electrode (e.g., by vapor deposition or coating) on the light emitting layer. A method of forming the electrode/hole auxiliary layer/electron auxiliary layer may be appropriately selected and is not particularly limited.

The electroluminescent device of an embodiment may be configured to emit red light, blue light, or green light. A wavelength range of the red light, blue light, or green light may be the same as described herein.

In the electroluminescent device of an embodiment, a maximum external quantum efficiency (EQE) may be greater than or equal to about 4%, greater than or equal to about 5%, greater than or equal to about 6%, greater than or equal to about 7%, greater than or equal to about 7.5%, greater than or equal to about 8%, greater than or equal to about 8.5%, greater than or equal to about 9%, greater than or equal to about 9.5%, or greater than or equal to about 10%. In the electroluminescent device of an embodiment, a maximum external quantum efficiency (EQE) may be less than or equal to about 100%, less than or equal to about 90%, less than or equal to about 80%, less than or equal to about 70%, less than or equal to about 60%, less than or equal to about 50%, less than or equal to about 40%, less than or equal to about 30%, or less than or equal to about 20%.

In an embodiment, the electroluminescent device may have a maximum luminance of about 10,000 nit (candelas per square meter (cd/m$^2$)) to about 1000,000 nit, about 30,000 nit to about 900,000 nit, about 40,000 nit to about 800,000 nit, about 50,000 nit to about 700,000 nit, about 60,000 nit to about 600,000 nit, about 70,000 nit to about 500,000 nit, about 80,000 nit to about 450,000 nit, about 90,000 nit to about 400,000 nit, about 100,000 nit to about 350,000 nit, about 110,000 nit to about 300,000 nit, about 120,000 nit to about 250,000 nit, about 130,000 nit to about 200,000 nit, about 140,000 nit to about 190,000 nit, about 150,000 nit to about 180,000 nit, or a combination thereof.

In an embodiment, the light emitting device may exhibit an improved life-span. In an embodiment, as measured by driving the device at a predetermined luminance (for example, from about 100 nit to about 3,000 nit, from about 200 nit to about 2,800 nit, from about 400 nit to about 2,600 nit, from about 600 nit to about 2,500 nit, from about 650 nit to about 2,000 nit, or a combination thereof) the light emitting device may have a T90 or T50 of greater than or equal to about 10 hours, greater than or equal to about 15 hours, greater than or equal to about 20 hours, greater than or equal to about 25 hours, greater than or equal to about 30 hours, greater than or equal to about 35 hours, greater than or equal to about 40 hours, or greater than or equal to about 45 hours. The T90 or T50 may be less than or equal to about 2,000 hours, less than or equal to about 1,500 hours, less than or equal to about 1,000 hours, less than or equal to about 500 hours, less than or equal to about 300 hours, or less than or equal to about 100 hours.

T50 (or T90) is a time taken for a luminance of a device to decrease to 50% of the initial brightness (100%) is determined as the device is driven at a predetermined brightness (e.g., 650 nit).

In an embodiment, a display device including the electroluminescent device described herein.

The display device may include a first pixel and a second pixel that is configured to emit light different from the first pixel. The first pixel, the second pixel, or a combination thereof may include the electroluminescent device of an embodiment.

The display device or an electronic apparatus may include (or may be) a television, a virtual reality/augmented reality (VR/AR), a handheld terminal, a monitor, a notebook computer, an electronic display board, a camera, or a part for an automatic, e.g., autonomous, vehicle.

Specific examples are described below. However, the examples described below are only for specifically illustrating or explaining the disclosure, and the scope of the disclosure is not limited thereto.

EXAMPLES

1. Ultraviolet (UV) Spectroscopy Analysis

UV-visible (Vis) absorption spectrum is obtained by using an Agilent Cary 5000 spectrophotometer.

2. Photoluminescence Analysis and Absolute Quantum Yield (QY) Measurement

Photoluminescence (PL) spectroscopy analysis is made for the nanoparticles at room temperature using a Hitachi F-7000 spectrophotometer or a Quantaurus-QY measurement equipment (Quantaurus-QY Absolute PL quantum yield spectrophotometer C11347-11) from Hamamatsu Co., Ltd according to the manual provided from the manufacturer.

3. Inductively Coupled Plasma (ICP) Analysis

An inductively coupled plasma-atomic emission spectroscopy (ICP-AES) analysis is performed using Shimadzu ICPS-8100.

4. Transmission Electron Microscopy (TEM) Analysis

Using an UT F30 Tecnai electron microscope, a TEM analysis is carried out to obtain a transmission microscope image for the nanocrystals as prepared.

5. X-Ray Diffraction

An XRD analysis is made by using Philips Xpert PRO with a power 3 kilowatts (kVV).

6. X-Ray Photoelectron Spectroscopy (XPS) Analysis

An X-ray photoelectron Spectroscopy analysis is performed using Quantum 2000 manufactured by Physical Electronics.

The following synthesis is performed under an inert gas atmosphere (e.g., under nitrogen) unless otherwise specified. A precursor content is provided as a molar content, unless otherwise specified.

Reference Example 1

A 2 molar ((moles per liter (M)) Se/TOP stock solution and a 0.1 M Te/TOP stock solution are prepared by dispersing selenium (Se) and tellurium (Te) in trioctylphosphine (TOP), respectively.

To a reactor containing trioctylamine, 0.125 millimoles (mmol) of zinc acetate is added with oleic acid and heated at 120° C. under vacuum. After 1 hour, nitrogen is introduced into the reactor.

The reactor is heated to 300° C., and the Se/TOP stock solution and the Te/TOP stock solution in a Te:Se mole ratio of 1:15 are rapidly injected into the reactor. When the reaction is complete, the reaction solution is rapidly cooled to room temperature and ethanol is added to the reactor. The reaction product mixture is centrifuged and the formed precipitate (ZnTeSe-based semiconductor nanocrystal particles) is separated and dispersed in an organic solvent (toluene, hexane, or octane) to obtain a particle organic dispersion.

A predetermined amount of zinc acetate and oleic acid are added to a 300 mL flask containing trioctylamine and the obtained mixture is heated at 120° C. under vacuum. Nitrogen ($N_2$) is then introduced into the reactor, and during the time when the mixture is heated to 340° C., the particle organic dispersion as obtained is added quickly and a Se/TOP stock solution is then added thereto to carry out a reaction between the zinc precursor and the selenium precursor.

When the reaction is complete, the reactor is cooled to room temperature and ethanol is added to the reactor to facilitate precipitation of the nanoparticles, which are separated by centrifuge to recover. Then, the obtained nanoparticles are dispersed in octane.

The amounts of the precursors used are controlled to obtain the composition as shown in Table 2.

For the nanoparticles thus obtained, an ICP-AES analysis is carried out and the results are shown in Table 2.

Reference Example 2

The semiconductor nanoparticles are prepared in the same manner as Reference Example 1 except for dispersing sulfur in TOP to obtain a 1 M S/TOP stock solution and adding the S/TOP stock solution after the addition of the Se/TOP stock solution.

For the nanoparticles thus obtained, an ICP-AES analysis is carried out and the results confirm that the nanoparticles further include the sulfur in comparison with the nanoparticles of Reference Example 1.

Figure 8A:
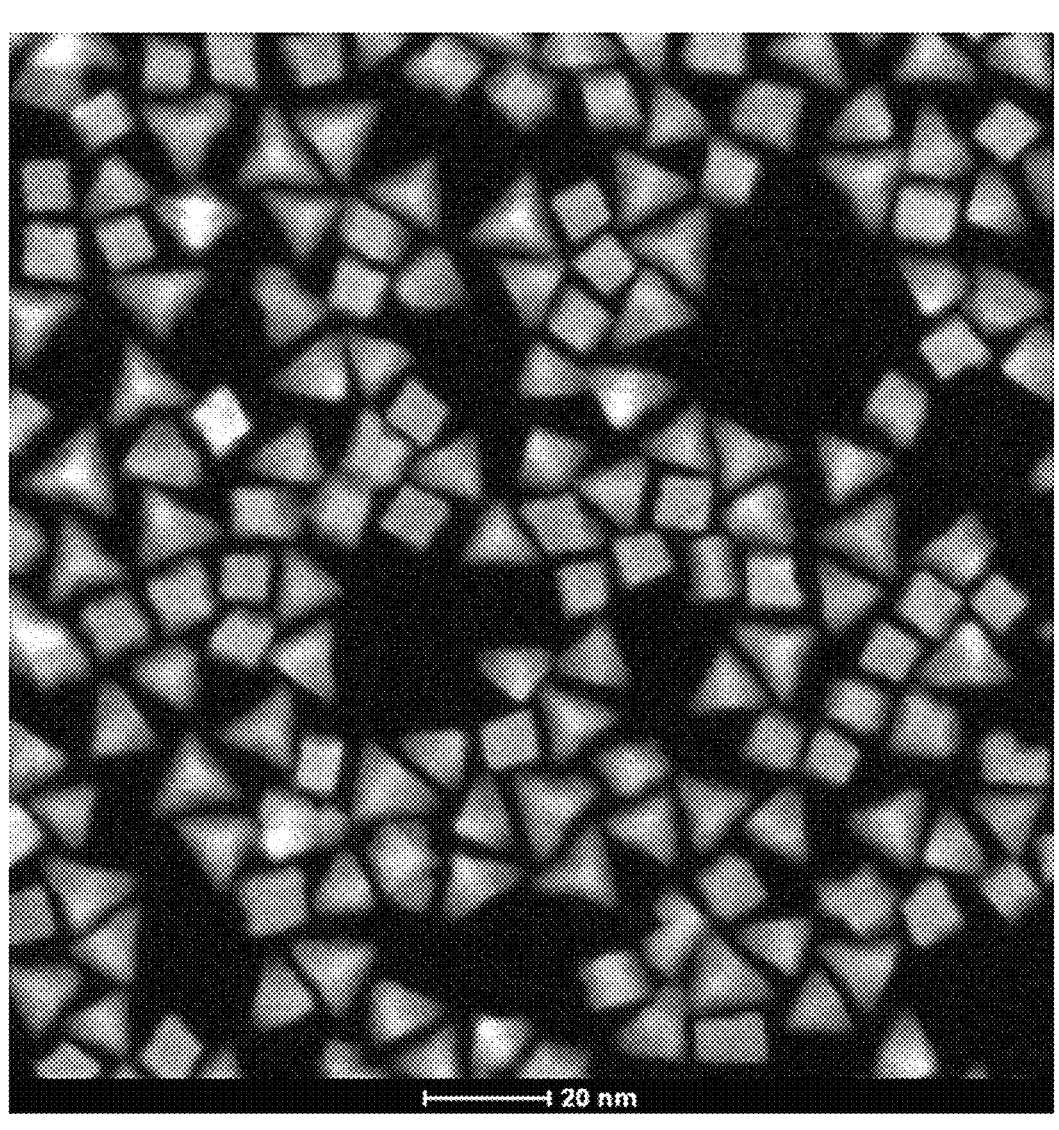
FIG. 8A shows an electron microscopy image of the semiconductor nanocrystals including Zn, Te, Se, and S as prepared in Reference Example 2.

For the nanoparticles thus obtained, a photoluminescent spectroscopy analysis and a TEM analysis are carried out and the results are shown in FIG. 8A and Table 3.

The obtained semiconductor nanocrystals have a size of about 10 nanometers (nm) and a circularity of about 0.75.

Example 1

An amount of 1.2 mmol of dibutyl magnesium is mixed with oleyl amine to prepare a magnesium precursor solution. Lithium aluminum hydride is dissolved in diphenyl phosphine to obtain an additive solution.

A 300 mL flask containing trioctylamine and oleyl amine is kept under vacuum at 120° C. for 15 minutes. Nitrogen ($N_2$) is then introduced into the reactor, and then the reactor is heated to 300° C. and then the additive solution, the magnesium precursor solution, and the Se/TOP stock solution are added to the flask simultaneously. Then, the reaction proceeds at 300° C. for 40 minutes.

When the reaction is complete, the reactor is cooled to room temperature and ethanol is added to the reactor to facilitate precipitation of the nanoparticles, which are separated by centrifuge to recover. Then, the obtained nanoparticles are dispersed in toluene.

A mole ratio of the oleyl amine, the additive solution, and the selenium precursor per one mole of the magnesium is 3:0.75:0.75, respectively.

Figure 4:
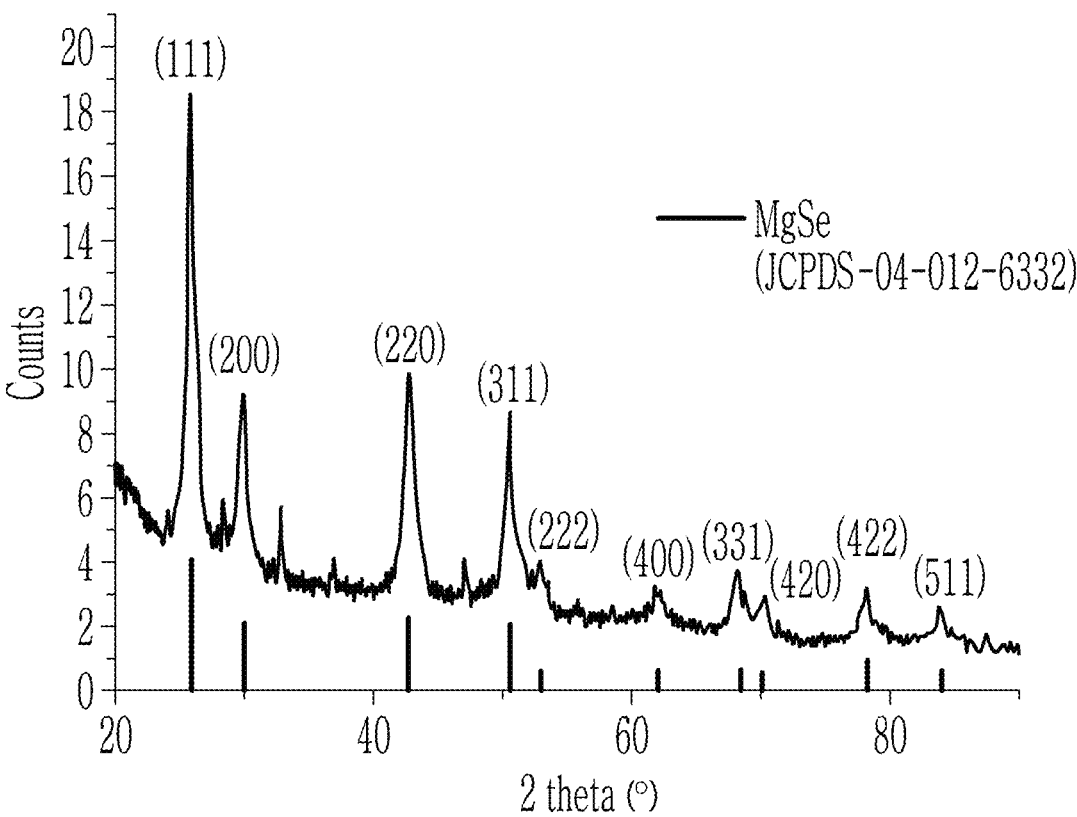
FIG. 4 is a graph of counts versus 2 theta ((degrees (°)) showing an X-ray diffraction spectrum of the magnesium selenide nanoparticles prepared in Example 1.
Figure 5:
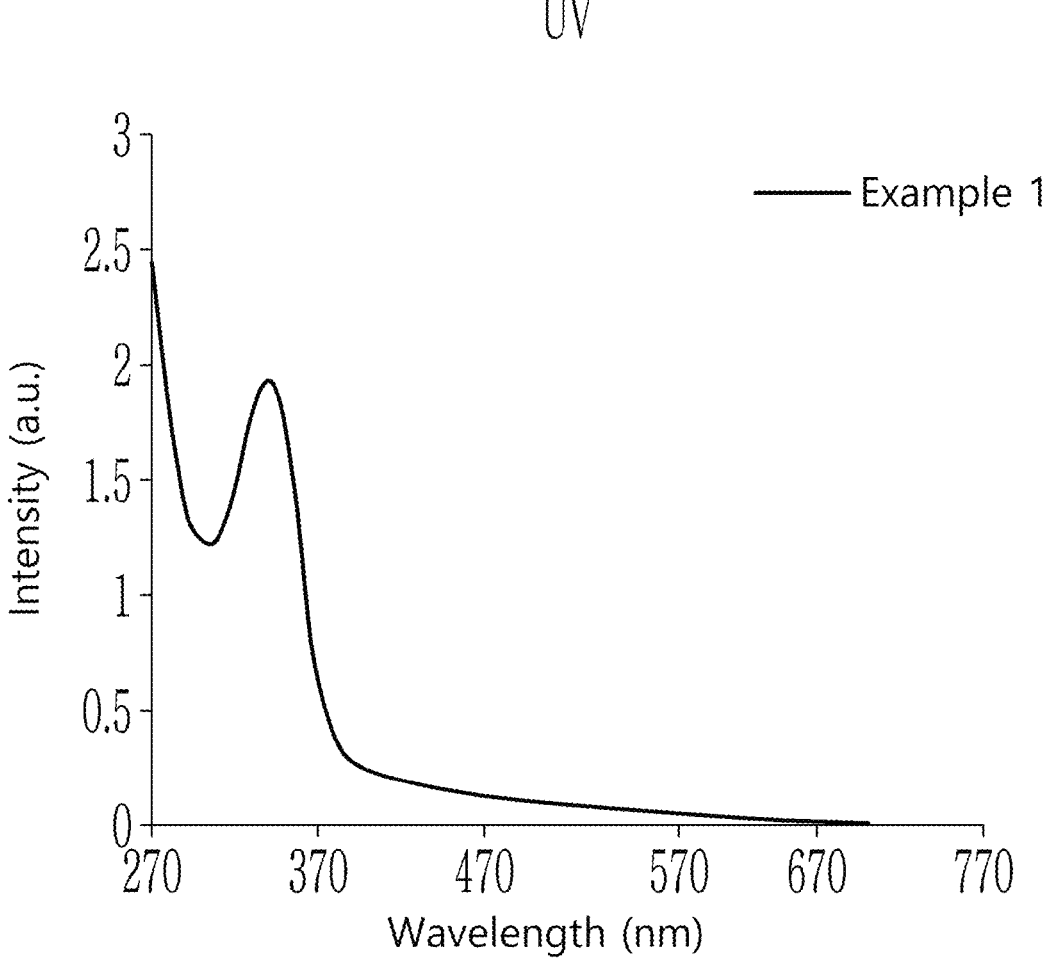
FIG. 5 is a graph of intensity (arbitrary units (a.u.)) versus wavelength (nanometers (nm) showing an ultraviolet-visible (UV-Vis) absorption spectrum of the magnesium selenide nanoparticles prepared in Example 1.

For the nanoparticles thus prepared, an X-ray diffraction analysis and a UV-Vis absorption spectroscopy analysis are conducted and the results are shown in FIG. 4 and FIG. 5.

The results of FIG. 4 confirm that the prepared nanoparticles have a crystalline structure of MgSe and do not exhibit peaks that can assigned to $Mg(OH)_2$ and MgO.

The results of FIG. 5 confirm that the UV-Vis absorption spectrum of the MgSe nanocrystal exhibit a noticeable first absorption peak and a valley adjacent to the first absorption peak. A valley depth is about 0.34, by the calculation, i.e., (1.9−1.25)/1.9=0.34.

Figure 6:
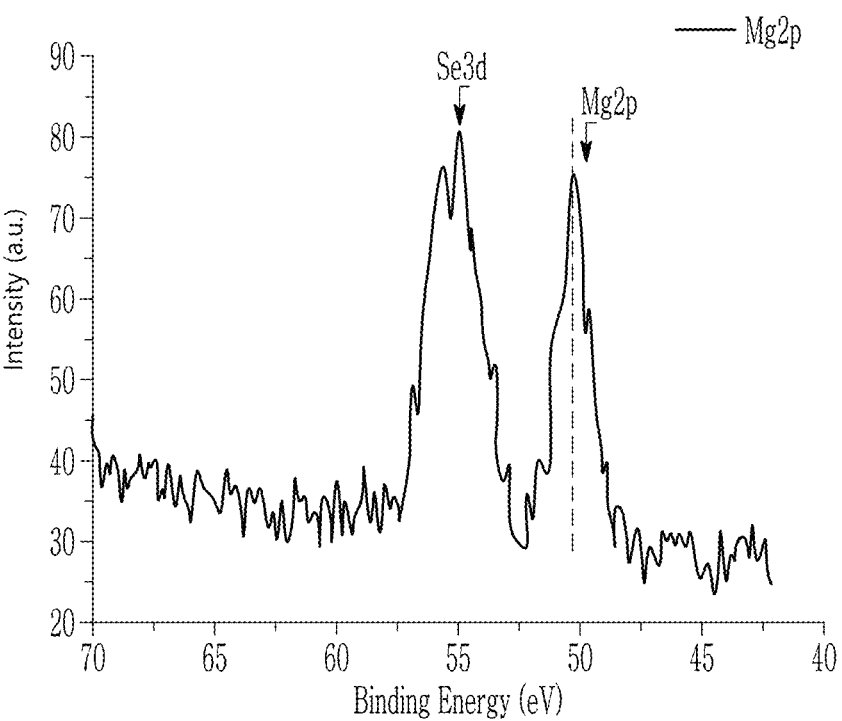
FIG. 6 is a graph of intensity (arbitrary units (a.u.)) versus binding energy (eV) showing a result of an X-ray photo-electron spectroscopy analysis of the magnesium selenide nanoparticles prepared in Example 1.
Figure 7:
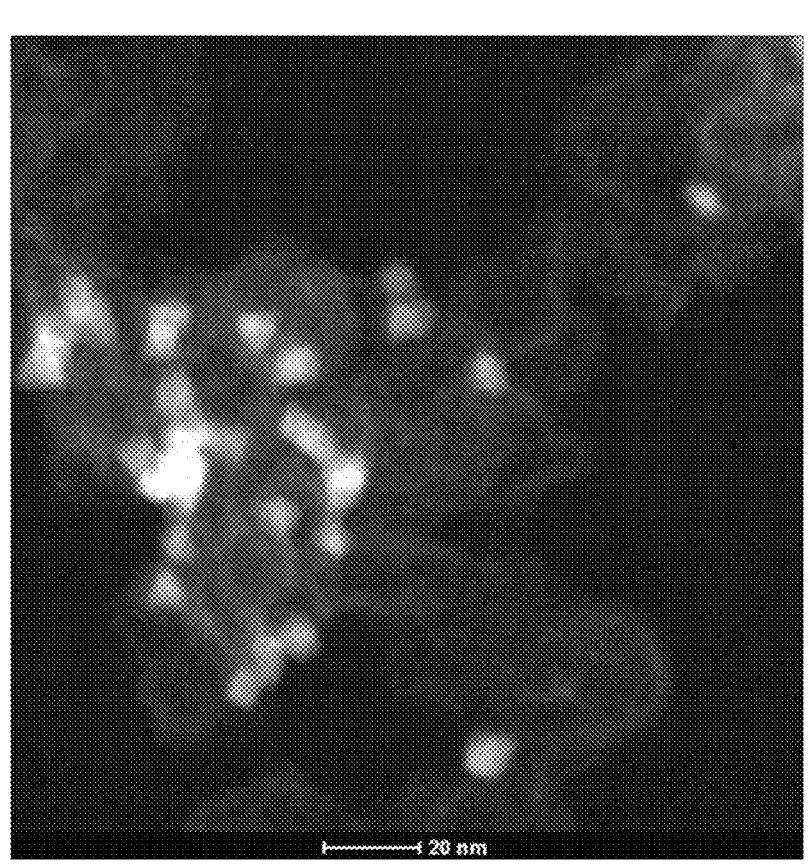
FIG. 7 shows an electron microscopy image of the magnesium selenide nanoparticles prepared in Example 1.

For the nanoparticles thus prepared, an XPS analysis and a TEM analysis are carried out and the results are shown in FIG. 6 and FIG. 7. The results of FIG. 6 show that the MgSe nanoparticles thus prepared exhibit a peak assigned to Mg2P at a binding energy of about 50.5 electronvolts (eV) (i.e., greater than 50 eV) and the curve including the peak has no split. An intensity ratio of the peak of Mg2P to the peak of Se3d is greater than or equal to about 0.8. These results indicate that the semiconductor nanoparticles of a magnesium selenide are prepared substantially without, e.g., free of, side products including Mg—O.

For the prepared nanoparticles, an ICP-AES analysis is conducted and the results are shown in Table 1.

TABLE 1

|  | Mg (mole percent (mol %)) | Li (mol %) | Se (mol %) |
| --- | --- | --- | --- |
| Example 1 | 0.44 | 0.23 | 0.33 |

Comparative Example 1

The semiconductor nanoparticles are prepared in the same manner as Example 1 except for not using the additive solution. For the nanoparticles thus prepared, an XPS analysis and a TEM analysis are carried out. The X-ray diffraction spectrum shows the magnesium oxide peak and the magnesium hydroxide peak. The results of the XPS analysis of the prepared nanoparticles show that the Mg2P peak appears at a binding energy of 49.5 to 49.8 eV.

Example 2-1 and Example 2-2

An amount of 1.2 mmol of dibutyl magnesium is mixed with oleyl amine to prepare a magnesium precursor solution. Lithium aluminum hydride is dissolved in diphenyl phosphine to obtain an additive solution.

A 300 mL flask containing trioctylamine and oleyl amine is kept under vacuum at 120° C. for 15 minutes. Nitrogen ($N_2$) is then introduced into the reactor, and then the reactor is heated to 300° C. and then semiconductor nanocrystals including zinc, selenium, sulfur, and tellurium as prepared in Reference Example 2 is added thereto, and then the additive solution, the magnesium precursor solution, and the Se/TOP stock solution are added to the flask simultaneously. Then, zinc oleate is further added to the reactor and the reaction for forming the Mg(Zn)Se proceeds for 100 minutes.

When the reaction is complete, the reactor is cooled to room temperature and ethanol is added to the reactor to facilitate precipitation of the nanoparticles, which are separated by centrifuge to recover. Then, the obtained nanoparticles (for Example 2-1) are dispersed in toluene.

A mole ratio of the oleyl amine, the additive solution, and the selenium precursor per one mole of the magnesium is 3:0.75:0.75, respectively. The amount of the selenium used is controlled so that the nanoparticles have the composition set forth in Table 2.

For the nanoparticles thus prepared, a TEM analysis, a TEM-EDX analysis, and an XPS analysis are conducted and the results are shown in FIG. 8*b*, FIG. 9, FIG. 10*a*, and FIG. 10*b*.

For the prepared nanoparticles, an ICP-AES analysis is conducted and the results are shown in Table 2.

Figure 8B:
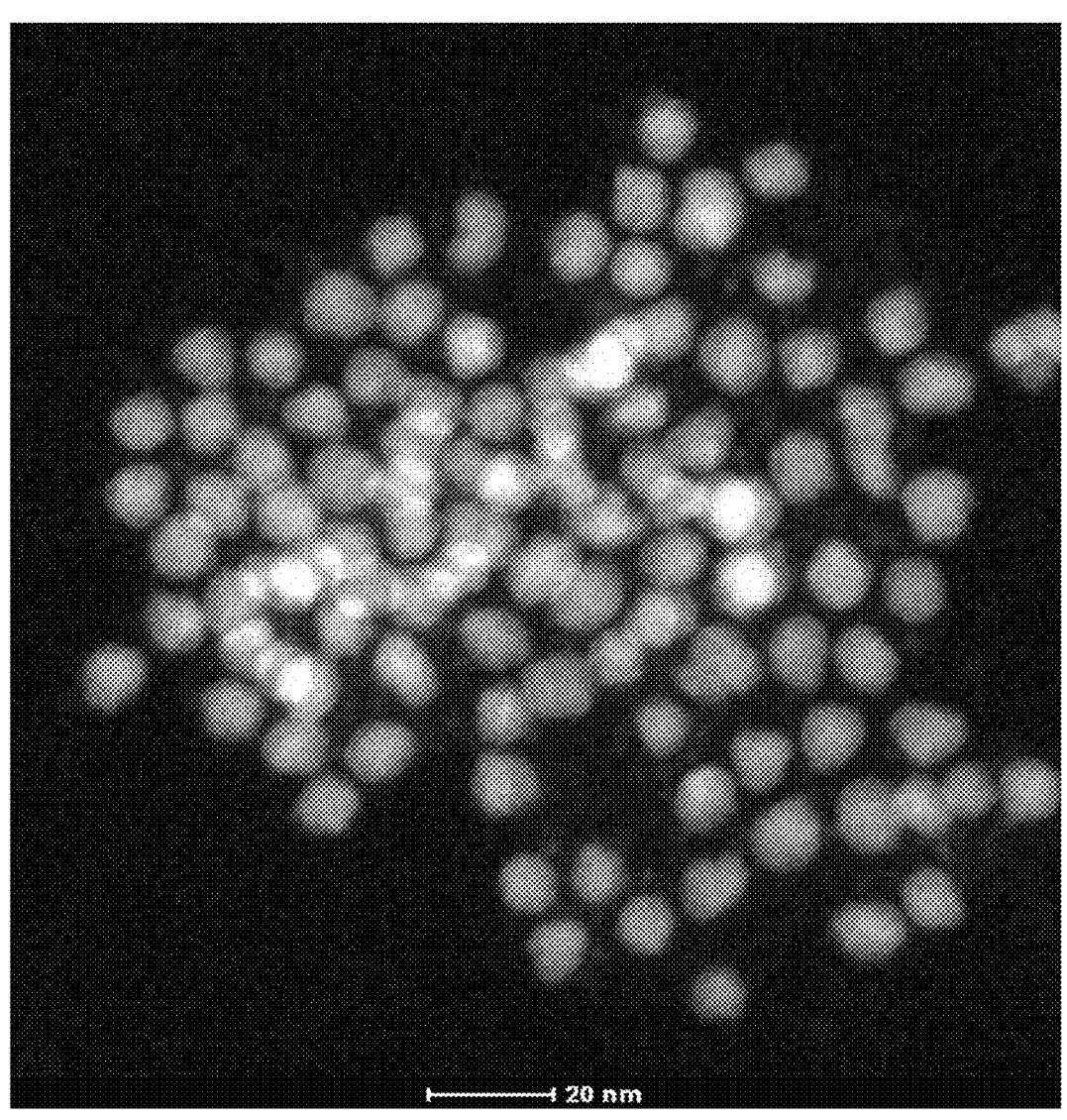
FIG. 8B shows an electron microscopy image of the semiconductor nanocrystals wherein a MgZnSe shell layer is formed on a semiconductor nanocrystal including Zn, Te, Se, and S as prepared in Example 2-1.

The results of FIG. 8B confirm that the prepared nanoparticles have improved circularity and uniform particle size distribution (an average particle size: 10.33 nm, standard deviation: about 8.7%, average solidity=0.96, average circularity=0.86).

Figure 9:
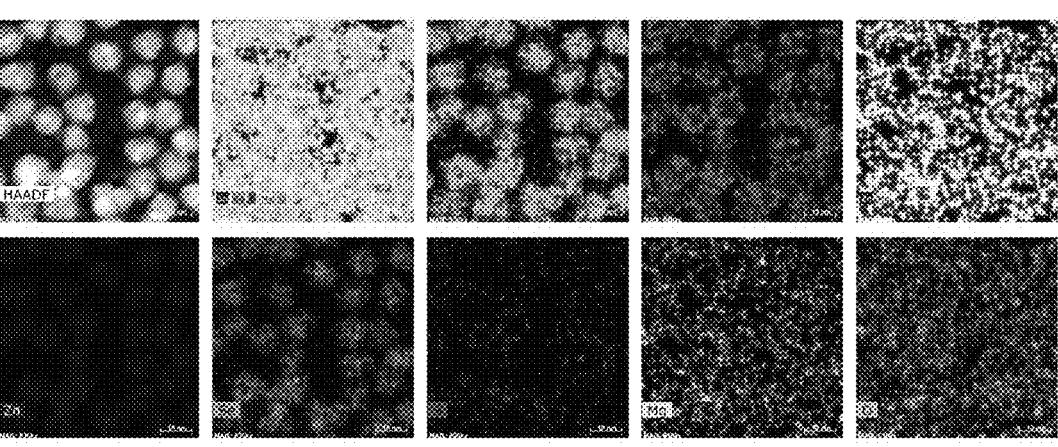
FIG. 9 shows a result of a transmission electron microscopy energy-dispersive X-ray spectroscopy (TEM-EDX) analysis of the semiconductor nanoparticles including MgZnSe shell layers as prepared in Example 2-1.

The results of FIG. 9 confirm that the prepared nanoparticles include the magnesium selenide. The XPS results confirm that a mole ratio of magnesium to zinc is about 0.178 and a mole ratio of selenium to zinc is about 0.607.

Figure 10A:
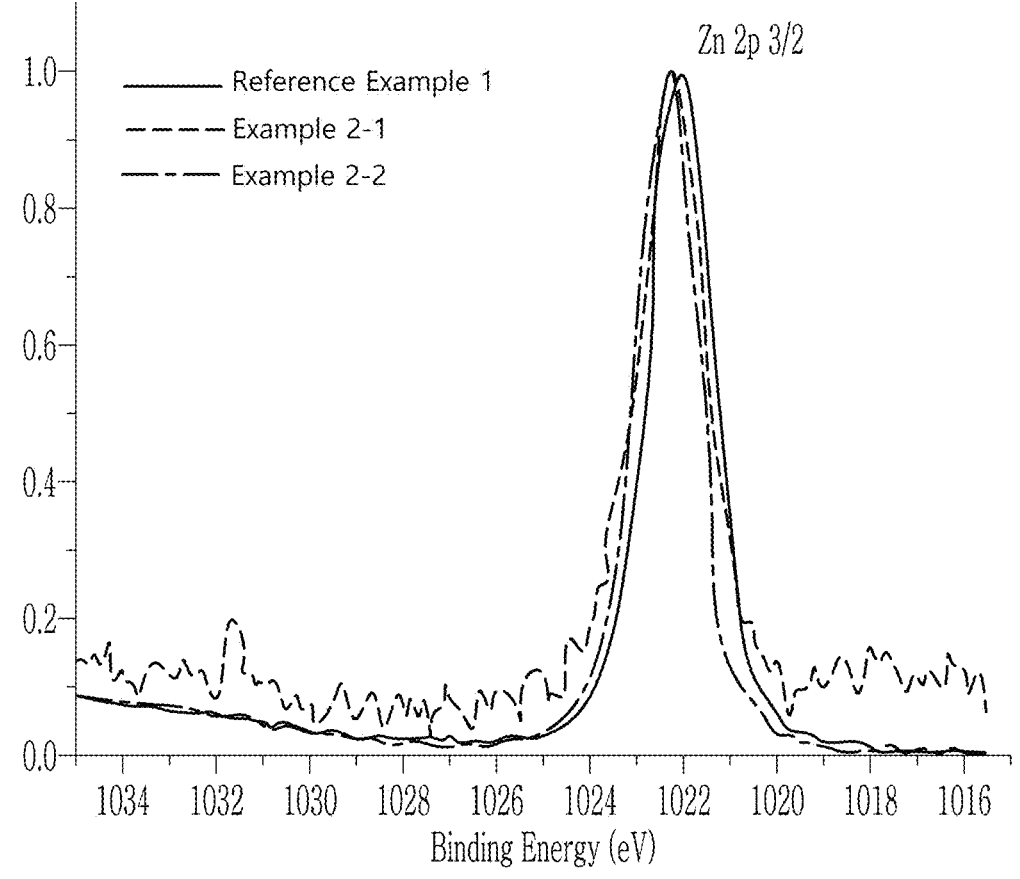
FIG. 10A is a graph of intensity (a.u.) versus binding energy (eV) showing a result (Zn2P 3/2) of an X-ray photoelectron spectroscopy (XPS) analysis of the semiconductor nanoparticles prepared in Reference Example 1, Example 2-1, and Example 2-2.
Figure 10B:
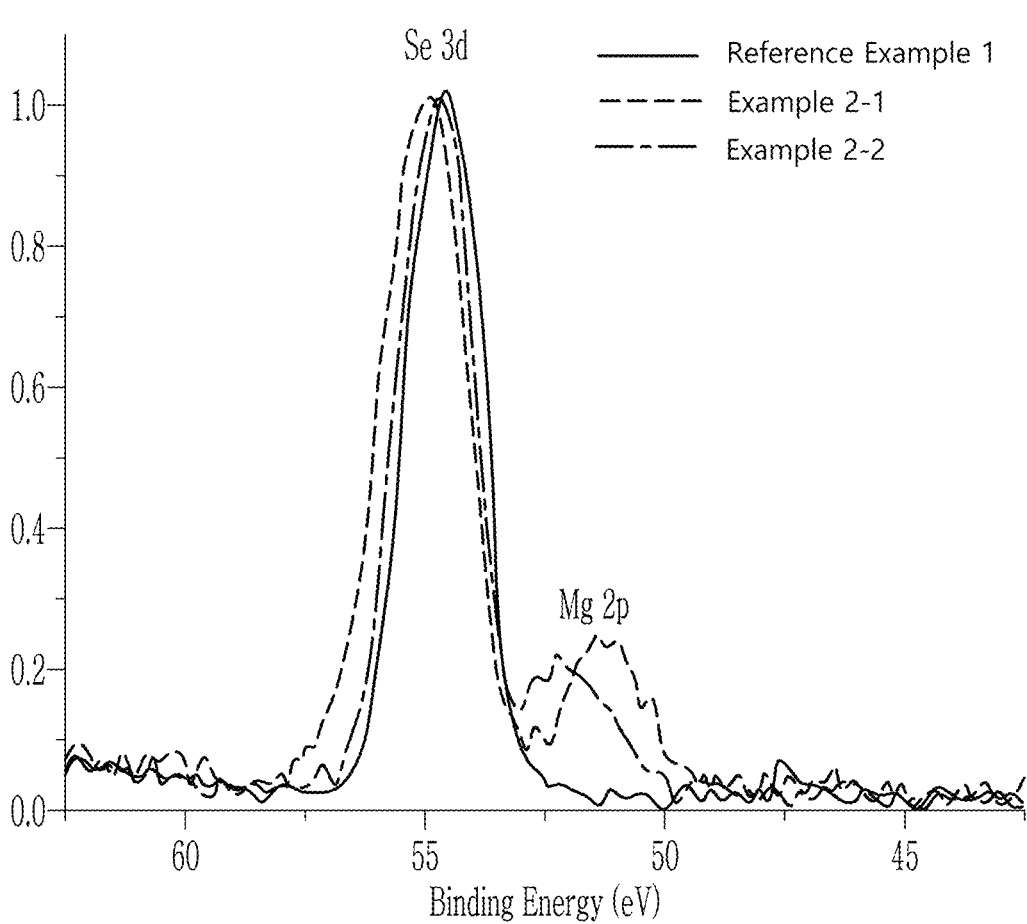
FIG. 10B is a graph of intensity (a.u.) versus binding energy (eV) showing a result (Se3d, Mg2p) of an XPS analysis of the semiconductor nanoparticles prepared in Reference Example 1, Example 2-1, and Example 2-2.

FIG. 10A and FIG. 10B show that the prepared nanoparticles have a magnesium peak at a binding energy of greater than or equal to about 50 eV, and this indicate that the crystal having the Mg—Se bond is formed.

For the preparation of the nanoparticles of Example 2-2, sulfur is dispersed in TOP to prepared 1M STOP stock solution. To the reaction mixture including the semiconductor nanoparticles having the Mg(Zn)Se layer, the zinc oleate and the S/TOP stock solution are further added to form a ZnS layer on the Mg(Zn)Se layer.

For the prepared nanoparticles of Example 2-2, an ICP-AES analysis and a photoluminescent spectroscopy analysis are conducted and the results are summarized in Table 2 and Table 3. A mole ratio of magnesium to tellurium is about 44 and a mole ratio of lithium to tellurium is about 3.

For the nanoparticles thus prepared, a TEM analysis and an XPS analysis are conducted and the results are shown in FIG. 8C, FIG. 9, FIG. 10A and FIG. 10B.

Figure 8C:
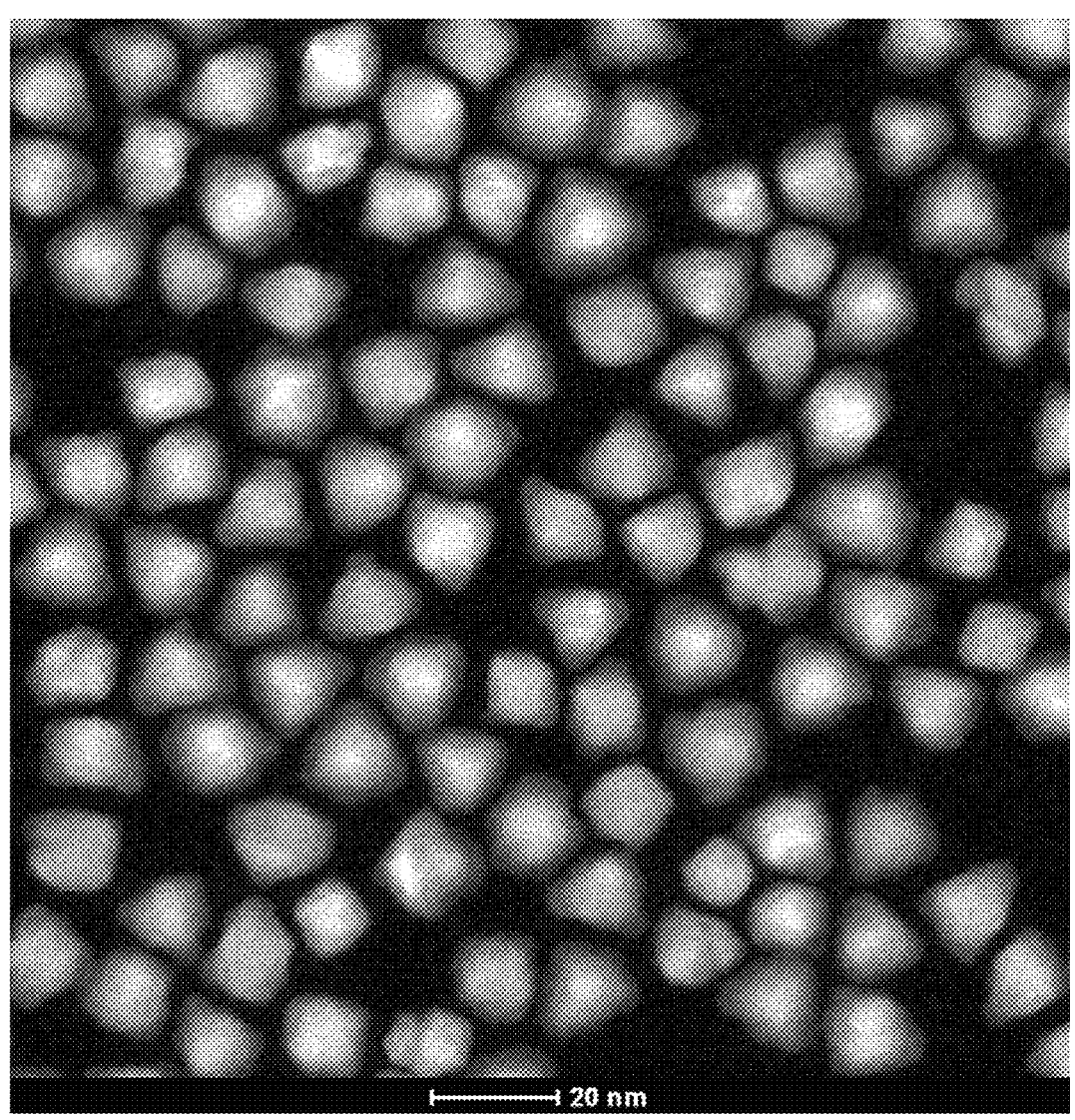
FIG. 8C is a microscopy image of the semiconductor nanoparticles as prepared in Example 2-2.

The results of FIG. 8C confirm that the prepared nanoparticles have improved circularity and uniform particle size distribution (an average particle size: 14.42 nm, standard deviation: about 6.9%, average solidity=0.96, average circularity=0.81).

The results of FIG. 9 confirm that the magnesium is distributed in the prepared nanoparticles.

The results of FIG. 10A and FIG. 10B confirm that the prepared nanoparticles have a magnesium peak at a binding energy of greater than or equal to about 50 eV, and this indicate that the crystal having the Mg—Se bond is formed.

TABLE 2

|  | Te:Se | (S + Se):Zn | Li:Mg | Mg:Te | S:Se | Mg:Zn | Li:Te | Te:Zn |
|---|---|---|---|---|---|---|---|---|
| Reference Example 1 | 0.01268 | 0.907 | — | — | 0 | 0 |  | 0.011 |
| Example 2-1 | 0.0028 | 1.14 | 0.045 | 222 | 0.149 | — | 10 | 0.00279 |
| Example 2-2 | 0.0026 | 0.931 | 0.068 | 44 | 0.198 | 0.089 | 3 | 0.00261 |

TABLE 3

|  | Luminescent wavelength (nm) | Full width at half maximum (nm) | Quantum yield (%) |
|---|---|---|---|
| Reference Example 2 | 457 | 32 | 65 |
| Example 2-2 | 453 | 28 | 88 |

The results of Table 3 confirm that the semiconductor nanoparticles including the Mg(Zn)Se shell exhibit significantly improved quantum yield together with a narrow full width at half maximum (FWHM). The results of Table 3 confirm that in the case of the nanoparticles of Example, a blue light can be emitted with an improved quantum efficiency and a narrow FWHM even when the particles include a relatively high amount of tellurium.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A method of producing a semiconductor nanoparticle, which comprises:

combining a magnesium precursor and an additive with a chalcogen precursor in a reaction medium comprising an organic solvent and an organic ligand;

heating the reaction medium to a reaction temperature; and reacting the magnesium precursor and the chalcogen precursor in the presence of the additive to form a magnesium chalcogenide, wherein the semiconductor nanoparticle comprises the magnesium chalcogenide, wherein the magnesium chalcogenide comprises magnesium; and selenium, sulfur, or a combination thereof, wherein the additive comprises a potassium-containing hydride compound, an aluminum-containing hydride compound, a sodium-containing hydride compound, or a combination thereof, and wherein the semiconductor nanoparticle further comprises an alkali metal, boron, or a combination thereof.

2. The method of claim 1, comprising adding the magnesium precursor to the reaction medium simultaneously with the additive; or adding the magnesium precursor to the reaction medium after adding the additive to the reaction medium.

3. The method of claim 1, wherein the hydride compound further comprises a substituted or unsubstituted $C_{1-50}$ alkyl group, boron, or a combination thereof.

4. The method of claim 1, wherein the magnesium precursor comprises a magnesium powder, an alkylated magnesium, an alkenylated magnesium, an arylated magnesium, a magnesium halide, a magnesium cyanide, a magnesium sulfate, a magnesium sulfonate, a magnesium nitrate, or a combination thereof, and wherein the additive comprises a substituted or unsubstituted lithium trialkyl borohydride, a substituted or unsubstituted dialkyl lithium borohydride, a substituted or unsubstituted dialkyl sodium borohydride, a substituted or unsubstituted dialkyl potassium borohydride, a lithium aluminum hydride, a substituted or unsubstituted aluminum hydride, a sodium borohydride, a sodium hydride, a lithium triethylborohydride, $NaBH_4$, a diisobutylaluminum hydride, or a combination thereof.

5. The method of claim 1, wherein the organic solvent comprises a primary amine, a secondary amine, a tertiary amine, a nitrogen-containing heterocyclic compound, a substituted or unsubstituted $C_{4-50}$ aliphatic hydrocarbon solvent, a $C_{6-50}$ substituted or unsubstituted aromatic hydrocarbon solvent, a substituted or unsubstituted phosphine solvent, a substituted or unsubstituted phosphine oxide solvent, an aromatic ether solvent, or a combination thereof, and wherein the organic ligand comprises RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, $R_2POOH$, or a combination thereof, wherein R and R' are each independently a substituted or unsubstituted $C_{1-40}$ aliphatic hydrocarbon, a substituted or unsubstituted $C_{6-40}$ aromatic hydrocarbon, or a combination thereof.

6. The method of claim 1, wherein the chalcogen precursor comprises an organic solvent and selenium, an organic solvent and sulfur, a thiol compound, a bis(trialkylsilyl) alkyl sulfide, a bis(trialkylsilyl) sulfide, an ammonium sulfide, a sodium sulfide, an organic solvent and tellurium, or a combination thereof.

7. The method of claim 1, wherein the magnesium precursor, the chalcogen precursor, the organic ligand, and the organic solvent do not comprise an oxygen containing moiety, and optionally wherein the reaction medium does not substantially comprise an oxygen molecule.

8. The method of claim 1, wherein the method further comprises adding a $C_{6-50}$ aromatic phosphine compound to the reaction medium.

9. The method of claim 1, wherein the reaction medium further comprises a particle comprising a semiconductor nanocrystal core, and the magnesium chalcogenide is formed on a surface of the particle.

10. The method of claim 1, wherein the semiconductor nanocrystal core comprises a zinc chalcogenide, an indium phosphide, an indium zinc phosphide, an indium gallium phosphide, or a combination thereof.

11. The method of claim 1, wherein an amount of the additive is greater than or equal to about 0.1 moles and less than or equal to about 10 moles, per one mole of the magnesium precursor, or wherein an amount of the chalcogen is greater than or equal to about 0.1 moles and less than or equal to about 10 moles, per one mole of the magnesium precursor.

12. The method of claim 1, wherein the semiconductor nanoparticle further comprises the alkali metal.

13. The method of claim 1, wherein in an X-ray photoelectron spectroscopy analysis of the semiconductor nanoparticle, a peak assigned to magnesium appears at a binding energy of greater than or equal to about 50 electronvolts and less than or equal to about 55 electronvolts.

14. The method of claim 1, wherein the method further comprises adding a zinc precursor to the reaction medium prior to initiating the reacting or during the reacting, and wherein the magnesium chalcogenide comprises a zinc magnesium chalcogenide.

15. A semiconductor nanoparticle produced by the method of claim 1, which comprises
a crystalline magnesium chalcogenide; and
a dopant,
wherein the dopant comprises the alkali metal, the boron, or a combination thereof,
wherein a size of the semiconductor nanoparticle is greater than or equal to about 5 nanometers and less than or equal to about 50 nanometers,
wherein the semiconductor nanoparticle does not comprise cadmium,
wherein in the semiconductor nanoparticle, a mole ratio of the dopant to the magnesium is greater than or equal to about 0.001:1 and less than or equal to about 1:1, and
wherein the semiconductor nanoparticle is configured to emit light.

16. The semiconductor nanoparticle of claim 15, wherein the semiconductor nanoparticle exhibits a cubic crystalline structure as determined by an X-ray diffraction analysis.

17. The semiconductor nanoparticle of claim 15, wherein the magnesium chalcogenide comprises a magnesium selenide, a magnesium sulfide, a magnesium telluride, a magnesium selenide sulfide, a magnesium selenide telluride, a magnesium telluride sulfide, a zinc magnesium selenide, a zinc magnesium sulfide, a zinc magnesium telluride, a zinc magnesium selenide sulfide, a zinc magnesium selenide telluride, a zinc magnesium telluride sulfide, or a combination thereof, optionally wherein in the semiconductor nanoparticle,
a mole ratio of an alkali metal or an alkaline earth metal except for magnesium to magnesium is greater than or equal to about 0.01:1 and less than or equal to about 1:1, or
a mole ratio of aluminum to magnesium is greater than or equal to about 0.01 and less than or equal to about 0.5.

18. The semiconductor nanoparticle of claim 15, wherein the semiconductor nanoparticle further comprises a zinc chalcogenide, and
wherein the zinc chalcogenide comprises zinc, tellurium, selenium, and optionally sulfur,
wherein in the semiconductor nanoparticle, a mole ratio of magnesium to tellurium is greater than or equal to about 1:1 and less than or equal to about 500:1, or
wherein in the semiconductor nanoparticle, a mole ratio of the dopant to tellurium is greater than or equal to about 0.1:1 and less than or equal to about 100:1.

19. The semiconductor nanoparticle of claim 15, wherein in an X-ray photoelectron spectroscopy analysis of the semiconductor nanoparticle, a peak assigned to magnesium appears at a binding energy of greater than or equal to about 50 electronvolts and less than or equal to about 55 electronvolts.

20. The semiconductor nanoparticle of claim 15, wherein the semiconductor nanoparticle comprises a semiconductor nanocrystal core and a semiconductor nanocrystal shell disposed on the semiconductor nanocrystal core, and
wherein
the semiconductor nanocrystal core comprises the magnesium chalcogenide and the dopant, and the semiconductor nanocrystal shell comprises a zinc chalcogenide, an indium phosphide, an indium gallium phosphide, or a combination thereof, or
the semiconductor nanocrystal core comprises a zinc chalcogenide, and the semiconductor nanocrystal shell comprises the magnesium chalcogenide and the dopant.

21. An electroluminescent device comprising
a first electrode and a second electrode spaced apart from each other; and
a light emitting layer disposed between the first electrode and the second electrode,
wherein the light emitting layer comprises the semiconductor nanoparticles of claim 15.

22. The electroluminescent device of claim 21, wherein the electroluminescent device further comprises a hole auxiliary layer between the light emitting layer and the first electrode, or
wherein the electroluminescent device further comprises an electron auxiliary layer between the light emitting layer and the second electrode, optionally wherein the hole auxiliary layer comprises an organic compound, the electron auxiliary layer comprises zinc magnesium metal oxide nanoparticles, or a combination thereof.

23. A display device comprising the semiconductor nanoparticle of claim 15.

24. A method of producing a semiconductor nanoparticle, which comprises:
combining a magnesium precursor and an additive with a chalcogen precursor in a reaction medium comprising an organic solvent and an organic ligand;
heating the reaction medium to a reaction temperature; and
reacting the magnesium precursor and the chalcogen precursor in the presence of the additive to form a magnesium chalcogenide,
wherein the semiconductor nanoparticle comprises the magnesium chalcogenide,
wherein the magnesium chalcogenide comprises magnesium; and
selenium, sulfur, or a combination thereof, and
wherein the additive comprises a hydride compound comprising an alkali metal, aluminum, or a combination thereof, and
wherein the semiconductor nanoparticle further comprises an alkali metal, boron, or a combination thereof.

* * * * *